US009233537B2

(12) United States Patent
Hayashi

(10) Patent No.: US 9,233,537 B2
(45) Date of Patent: Jan. 12, 2016

(54) METHOD OF MANUFACTURING LIQUID EJECTION HEAD, METHOD OF MANUFACTURING RECORDING APPARATUS INCLUDING THE SAME, LIQUID EJECTION HEAD, AND RECORDING APPARATUS

(75) Inventor: Hideki Hayashi, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 1713 days.

(21) Appl. No.: 12/715,511

(22) Filed: Mar. 2, 2010

(65) Prior Publication Data

US 2010/0220152 A1 Sep. 2, 2010

(30) Foreign Application Priority Data

Mar. 2, 2009 (JP) ................................ 2009-048513

(51) Int. Cl.
*B21D 53/76* (2006.01)
*B23P 17/00* (2006.01)
(Continued)

(52) U.S. Cl.
CPC ............ *B41J 2/14209* (2013.01); *B41J 2/1609* (2013.01); *B41J 2/1623* (2013.01); *B41J 2/1626* (2013.01); *B41J 2/1631* (2013.01); *B41J 2002/14217* (2013.01); *B41J 2002/14225* (2013.01); *B41J 2002/14306* (2013.01); *B41J 2002/14459* (2013.01); *B41J 2002/14491* (2013.01); *B41J 2202/20* (2013.01); *Y10T 29/49401* (2015.01)

(58) Field of Classification Search
CPC ........ B41J 2/1623; B41J 2/1631; H01L 41/39
USPC ............................................ 29/890.1, 25.35
See application file for complete search history.

(56) References Cited

U.S. PATENT DOCUMENTS 4,704,675 A * 11/1987 Jacobs et al. .................... 347/14
5,576,745 A * 11/1996 Matsubara ...................... 347/14
(Continued)

FOREIGN PATENT DOCUMENTS

JP H08-001928 A 1/1996
JP H08-118619 A 5/1996
(Continued)

OTHER PUBLICATIONS

Japan Patent Office; Notification of Reason for Refusal for Patent Application No. JP2009-048513, dated Dec. 14, 2010. (counterpart to above-captioned U.S. patent application).

*Primary Examiner* — David Angwin
(74) *Attorney, Agent, or Firm* — Merchant & Gould PC

(57) ABSTRACT

A method of manufacturing a liquid ejection head having a plurality of passage modules that have individual passages, actuator modules that include a plurality of actuators and a drive unit and the liquid ejection head produced by the method. The method comprising ranking the actuator modules according to a magnitude of a capacitance of the actuators, classifying the passage modules into a terminal region group and a central region group, fixing the actuator modules to the passage modules so that the actuator modules that having a capacitance not less than a predetermined capacitance correspond to the passage modules in the terminal group and so that the actuator modules having a capacitance less than the predetermined capacitance in the actuator module ranking correspond to the passage modules in the central region group.

10 Claims, 15 Drawing Sheets

(51) Int. Cl.

| | |
|---|---|
| ***H01L 41/22*** | (2013.01) |
| ***H04R 17/00*** | (2006.01) |
| ***B41J 2/14*** | (2006.01) |
| ***B41J 2/16*** | (2006.01) |

(56) References Cited

U.S. PATENT DOCUMENTS

| | | | | |
|---|---|---|---|---|
| 6,036,297 | A * | 3/2000 | Hayasaki | 347/13 |
| 6,231,154 | B1 * | 5/2001 | Corrigan | 347/17 |
| 6,796,631 | B2 * | 9/2004 | Kojima | 347/19 |
| 6,984,010 | B2 * | 1/2006 | Hosono et al. | 347/19 |
| 7,438,376 | B2 * | 10/2008 | Tamura et al. | 347/17 |
| 2003/0146742 | A1 * | 8/2003 | Nishida et al. | 324/76.11 |
| 2005/0248627 | A1 * | 11/2005 | Ito et al. | 347/71 |
| 2005/0259136 | A1 * | 11/2005 | Sekiguchi | 347/71 |
| 2008/0211851 | A1 * | 9/2008 | Murashima | 347/17 |

FOREIGN PATENT DOCUMENTS

| | | | |
|---|---|---|---|
| JP | 2005-178202 | A | 7/2005 |
| JP | 2005-319645 | A | 11/2005 |
| JP | 2005-329628 | A | 12/2005 |
| JP | 2007-318932 | A | 12/2007 |
| JP | 2008-074041 | A | 4/2008 |
| JP | 2008-221735 | A | 9/2008 |

* cited by examiner

METHOD OF MANUFACTURING LIQUID EJECTION HEAD, METHOD OF MANUFACTURING RECORDING APPARATUS INCLUDING THE SAME, LIQUID EJECTION HEAD, AND RECORDING APPARATUS

CROSS REFERENCE TO RELATED APPLICATION

The present application claims priority from Japanese Patent Application No. 2009-048513, which was filed on Mar. 2, 2009, the disclosure of which is incorporated herein by reference in its entirety.

BACKGROUND

The present invention relates to a method of manufacturing a liquid ejection head that ejects a liquid onto a recording medium to form an image, a method of manufacturing a recording apparatus that includes the liquid ejection head, a liquid ejection head, and a recording apparatus.

For example among inkjet heads used in inkjet type recording apparatuses, there are so-called piezo type heads with which an actuator is deformed to apply pressure to an ink in a pressure chamber and thereby eject the ink from a nozzle. With the piezo type inkjet head, a driver IC or other drive unit is provided to supply a drive voltage to the actuator and the drive unit is known to generate heat due to the drive voltage (see JP-A-2008-074041, for example).

SUMMARY

Further, when using an ink of comparatively high viscosity and low fluidity, use of the heat generated by the drive unit described in JP-A-2008-074041 to raise a temperature of the ink to thereby increase the fluidity of the ink and realize appropriate recording has been considered. However, there is a problem that recording of good quality cannot be realized due to ink fluidity differences arising from temperature variations within one head or within an inkjet type recording apparatus that includes a plurality of heads.

An object of an exemplary embodiment of the present invention is to provide a method of manufacturing a liquid ejection head, a method of manufacturing a recording apparatus that includes the same, a liquid ejection head, and a recording apparatus with which, even in a case of using a liquid of comparatively high viscosity, the liquid can be made uniform in fluidity within a head passage to achieve good quality recording.

To achieve the object, The exemplary embodiments of the present invention provide a method of manufacturing a liquid ejection head having: not less than three passage modules, each passage module including a plurality of individual passages, each individual passage leading through a pressure chamber to a liquid ejection port that ejects a liquid; not less than three actuator modules, each actuator module including a plurality of actuators, which respectively apply pressure to the liquid in the plurality of pressure chambers in each passage module; and a drive unit, which is thermally coupled to the passage modules and which supplies a drive voltage to the actuator modules corresponding to the passage modules;

the method of manufacturing comprising:

ranking the actuator modules respectively according to a magnitude of a capacitance of the actuators;

classifying the passage modules respectively into a terminal region group, which includes at least two passage modules placed in a terminal region in regard to at least one alignment direction of the passage modules, and a central region group, which includes at least one passage module placed in a central region exclusive of the terminal region; and fixing the actuator modules to the passage modules so that the actuator modules that were ranked as having a capacitance not less than a predetermined capacitance in the actuator module ranking correspond to the passage modules that were classified as belonging to the terminal region group in the passage module classifying, and so that the actuator modules that were ranked as having a capacitance less than the predetermined capacitance in the actuator module ranking correspond to the passage modules that were classified as belonging to the central region group in the passage module classifying.

The exemplary embodiments of the invention provide a method of manufacturing a recording apparatus including not less than three liquid ejection heads, each liquid ejection head having: not less than one passage module, each passage module including a plurality of individual passages, each individual passage leading through a pressure chamber to a liquid ejection port that ejects a liquid; not less than one actuator module, each actuator module including a plurality of actuators, which respectively apply pressure to the liquid in the plurality of pressure chambers in the passage module; and a drive unit, which is thermally coupled to the passage modules and which supplies a drive voltage to the actuator module corresponding to the passage module, the method of manufacturing comprising:

ranking the actuator modules of the at least three liquid ejection heads, respectively according to a magnitude of a capacitance of the actuators;

classifying the passage modules of the at least three liquid ejection heads respectively into a terminal region group, which includes at least two passage modules placed in a terminal region in regard to at least one alignment direction of the passage modules, and a central region group, which includes at least one passage module placed in a central region exclusive of the terminal region; and fixing the actuator modules to the passage modules so that the actuator modules that were ranked as having a capacitance not less than a predetermined capacitance in the actuator module ranking correspond to the passage modules that were classified as belonging to the terminal region group in the passage module classifying, and so that the actuator modules that were ranked as having a capacitance less than the predetermined capacitance in the actuator module ranking correspond to the passage modules that were classified as belonging to the central region group in the passage module classifying.

The exemplary embodiments of the invention provide a liquid ejection head comprising:

not less than three passage modules, each passage module including a plurality of individual passages, each individual passage leading through a pressure chamber to a liquid ejection port that ejects a liquid;

not less than three actuator modules, each actuator module including a plurality of actuators, which respectively apply pressure to the liquid in the plurality of pressure chambers in each passage module; and a drive unit, which is thermally coupled to the passage modules and which supplies a drive voltage to the actuator modules corresponding to the passage modules; and wherein the actuator modules are fixed to the passage modules so that the actuator modules that have a capacitance not less than a predetermined capacitance correspond to the passage modules that belong to a terminal region group, which includes at least two passage modules placed in a terminal region in regard to at least one alignment direction of the passage modules, and wherein the actuator modules that have a capacitance less than the predetermined capacitance correspond to the passage modules that belong to a central region group that includes at least one passage module placed in a central region exclusive of the terminal region.

The exemplary embodiments of the invention provide a recording apparatus comprising:

not less than three liquid ejection heads, each liquid ejection head comprising:

not less than one passage module, each passage module including a plurality of individual passages, each individual passage modules leading through a pressure chamber to a liquid ejection port that ejects a liquid;

not less than one actuator module, each actuator module including a plurality of actuators respectively applying pressure to the liquid in the plurality of pressure chambers in the passage module; and a drive unit thermally coupled to the passage modules and supplying a drive voltage to the actuator module corresponding to the passage module, and wherein the actuator modules are fixed to the passage modules so that the actuator modules that have a capacitance not less than a predetermined capacitance, correspond to the passage modules belonging to a terminal region group, which includes at least two passage modules placed in a terminal region in regard to at least one alignment direction of the passage modules, and the actuator modules that have a capacitance less than the predetermined capacitance correspond to the passage modules belonging to a central region group including at least one passage module placed in a central region exclusive of the terminal region.

DETAILED DESCRIPTION OF EXEMPLARY EMBODIMENTS

Exemplary embodiments of the present invention will now be described with reference to the drawings.

First, an overall configuration of an inkjet printer 1 according to an embodiment of a recording apparatus of the present invention shall be described with reference to FIG. 1. The inkjet printer 1 includes four inkjet heads 10 according to an embodiment of a liquid ejection head of the present invention.

Figure 1:
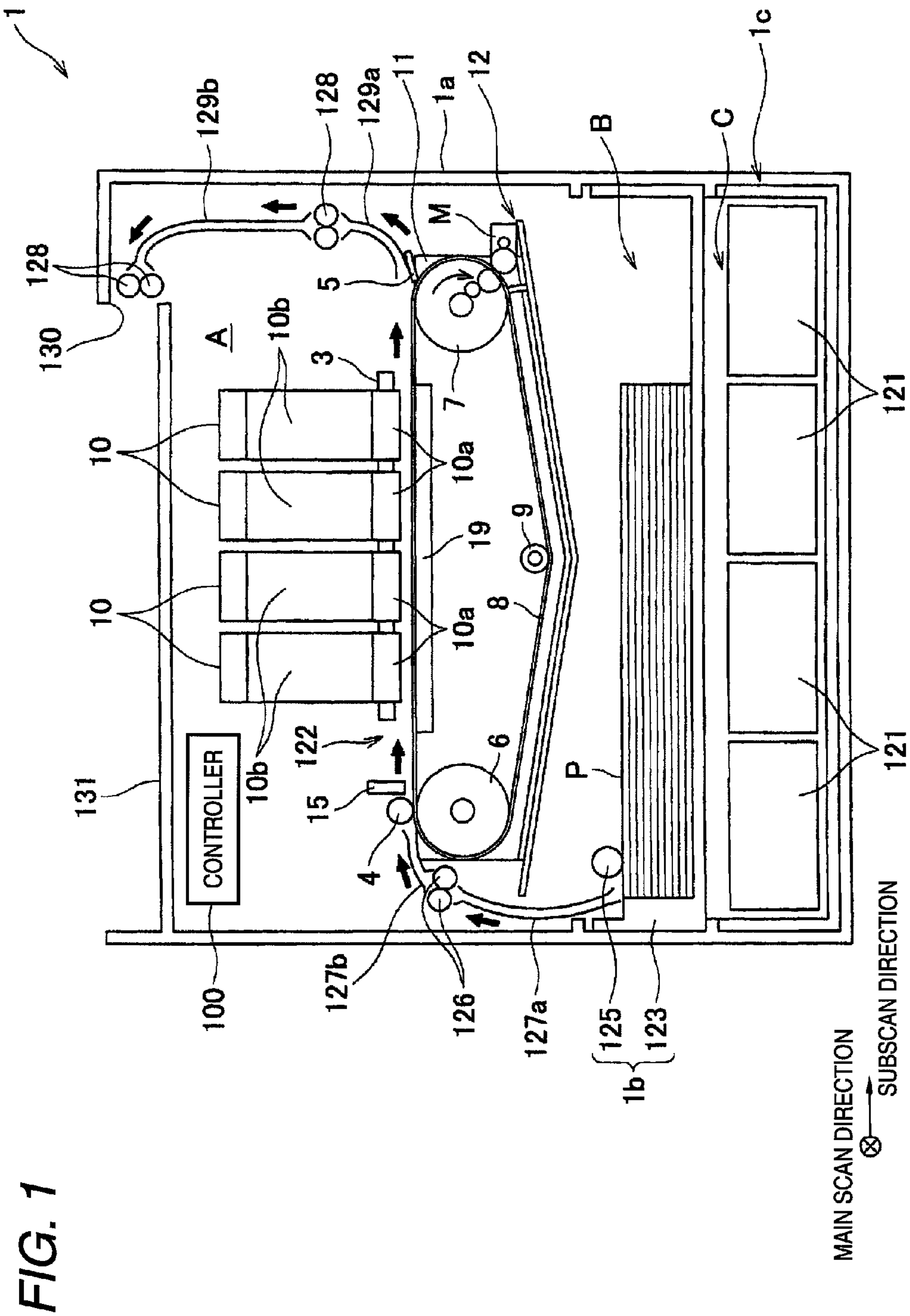
FIG. 1 is a sectional side view of an inkjet printer according to an exemplary embodiment of a recording apparatus of the present invention that includes four inkjet heads according to an exemplary embodiment of a liquid ejection head of the present invention.

As shown in FIG. 1, the inkjet printer 1 includes a casing 1*a* with a rectangular parallelepiped shape. A sheet ejection portion 131, receiving a sheet P on which recording has been performed and which is ejected from an opening 130, is formed at an upper portion of a top panel of the casing 1*a*. An internal space of the casing 1*a* is divided into spaces A, B, and C in that order from an upper side, and four inkjet heads 10 ejecting inks of respective colors of magenta, cyan, yellow, and black, a conveying unit 122 conveying the sheet P, and a controller 100 controlling operations of respective portions of the printer 1 are disposed in the space A. Each head 10 is disposed so that its longitudinal direction lies along a main scan direction, and the conveying unit 122 conveys the sheet P in a subscan direction. The spaces B and C are spaces in which are respectively disposed a sheet supply unit 1*b* and an ink tank unit 1*c* that are detachable along the main scan direction from the casing 1*a*.

Figure 2:
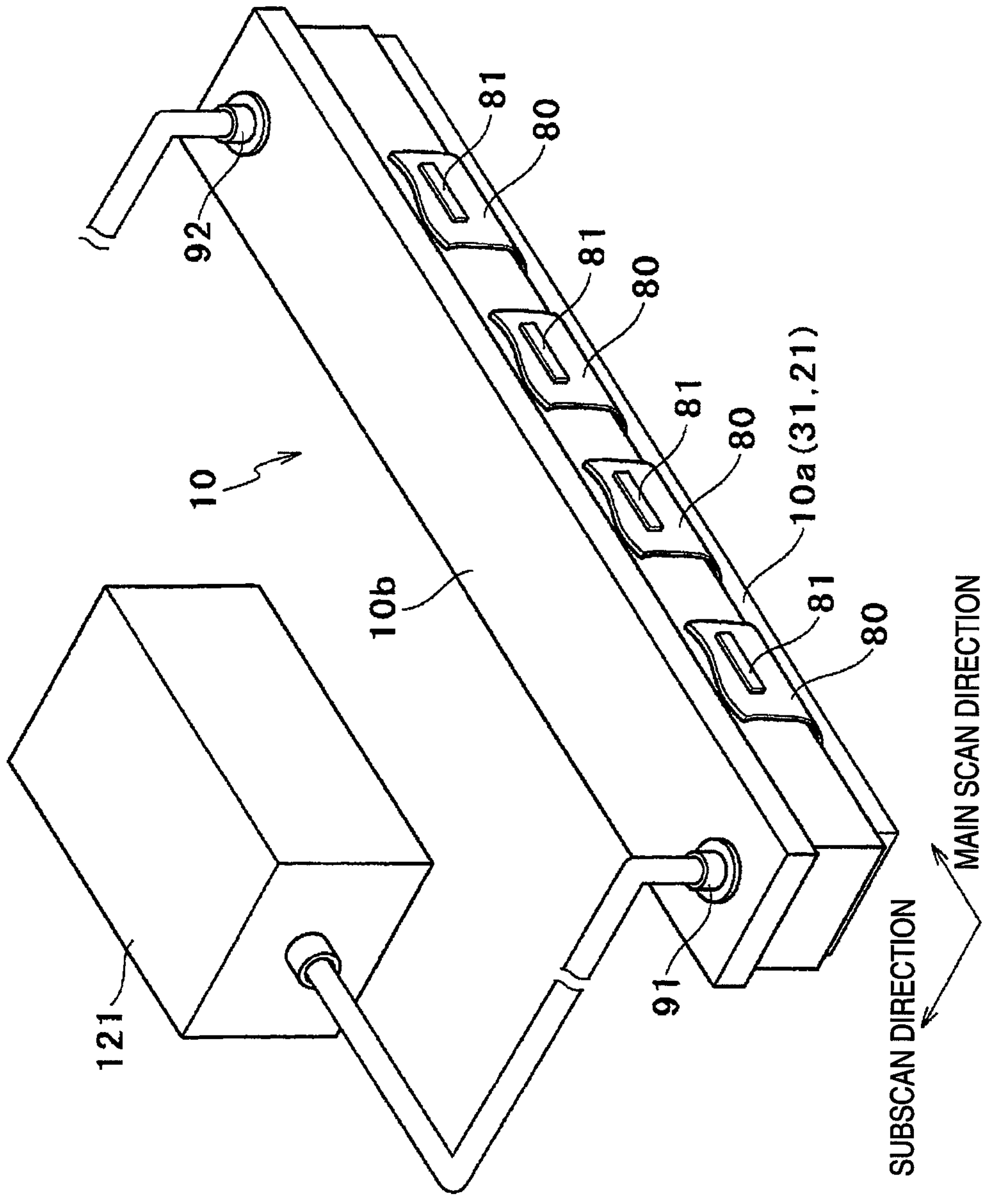
FIG. 2 is a perspective view of the inkjet head.

The ink tank unit 1*c* includes four main tanks 121 storing the respective color inks corresponding to the four heads 10. Each main tank 121 is connected via a tube to the corresponding head 10 as shown in FIG. 2.

The sheet supply unit 1*b* includes: a sheet supply tray 123 capable of housing a plurality of the sheets P; and a sheet supply roller 125 mounted to the sheet supply tray 123. Starting from an uppermost sheet, the sheets P in the sheet supply tray 123 are successively fed out by the sheet supply roller 125, guided by guides 127*a* and 127*b*, and fed to the conveying unit 122 while being sandwiched by a feed roller pair 126.

The conveying unit 122 includes: two belt rollers 6 and 7; an endless conveyor belt 8 wound spanningly across both rollers 6 and 7; a tension roller 9 adding tension to the conveyor belt 8 by being urged downward while contacting an inner peripheral surface of a lower loop of the conveyor belt 8; and a support frame 11 rotatably supporting the rollers 6, 7, and 9. When the belt roller 7, which is a drive roller, rotates clockwise in FIG. 1, the conveyor belt 8 travels, and the belt roller 6, which is a driven roller, rotates clockwise in FIG. 1 as well. A driving force from a conveyor motor M is transmitted via several gears to the belt roller 7.

An upper loop of the conveyor belt 8 is supported by a platen 19 so that a belt surface extends parallel to lower surfaces (ejection surfaces in which a plurality of ejection ports 18 that eject ink are opened (see FIGS. 4 and 5)) of the four heads 10 while being separated from the lower surface by a predetermined distance. The four heads 10 are disposed in parallel along the subscan direction and are supported by the casing 1*a* via a frame 3.

An anti-dropping plate 12 that is bent to a V-shape is disposed below the conveying unit 122, and foreign matter dropping from the sheet P, the conveyor belt 8, etc., are held by the anti-dropping plate 12.

A weakly adhesive silicon layer is formed on the surface of the conveyor belt 8. The sheet P fed to the conveyor unit 122 is pressed against the surface of the conveyor belt 8 by the presser roller 4 and is thereafter conveyed in the subscan direction along a solid, black arrow while being held on the conveyor belt 8 surface by the adhesive force of the surface. A sensor 15 detects that the sheet P is disposed so as to oppose the upper loop surface of the conveyor belt 8 at an immediately downstream side of the presser roller 4 in the subscan direction. The controller 100 ascertains the position of the sheet P based on a detection signal from the sensor 15 to control the driving of the heads 10.

During passage of the sheet P immediately below the four heads 10, the inks of the respective colors are ejected toward an upper surface of the sheet P from the ejection surfaces of the respective heads 10, thereby forming a desired color image on the sheet P. The sheet P is then separated from the surface of conveyor belt 8 by a separation plate 5, guided by guides 129*a* and 129*b*, conveyed upward while being sandwiched by two sets of feeding roller pairs 128, and ejected to the sheet ejection portion 131 from the opening 130 formed at the upper portion of the casing 1*a*.

A configuration of each head 10 shall now be described in detail with reference to FIGS. 1 to 6.

Figure 3:
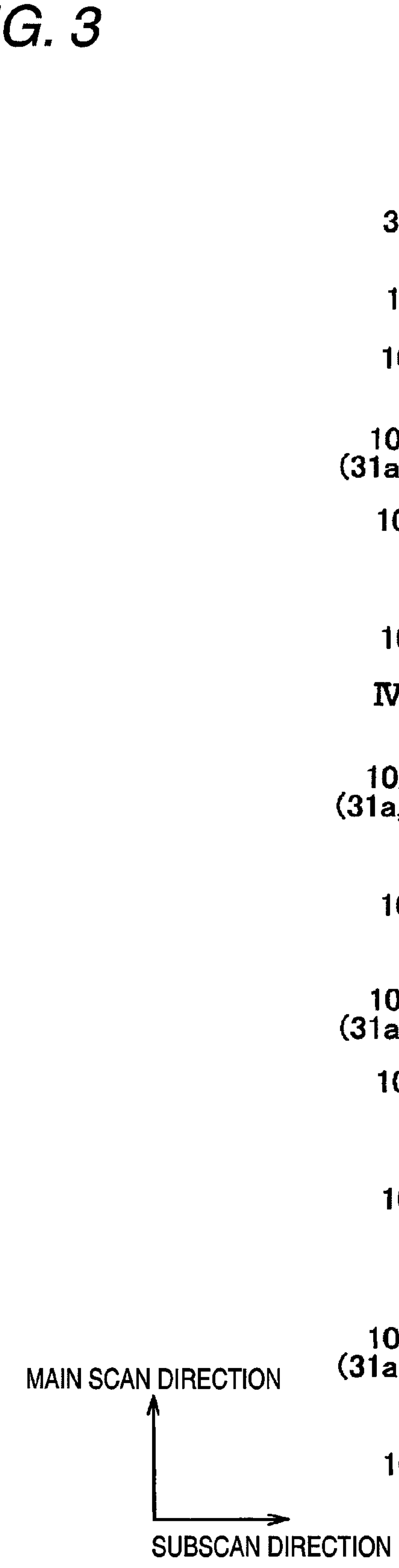
FIG. 3 is a plan view of a main head body of the inkjet head.

As shown in FIGS. 1 and 2, each head 10 includes a main head body 10*a* and a reservoir unit 10*b* in that order from a lower side. As shown in FIG. 3, the main head body 10*a* is a rectangular laminate that is elongated in the main scan direction in plan view. The main head body 10*a* has a passage unit 31 including: a substrate 31*b* having trapezoidal openings in a staggered manner along the main scan direction; eight, mutually-independent, trapezoidal passage modules 31*a*; and eight trapezoidal actuator modules 21 respectively disposed on upper surfaces of the passage modules 31*a*.

Figure 5:
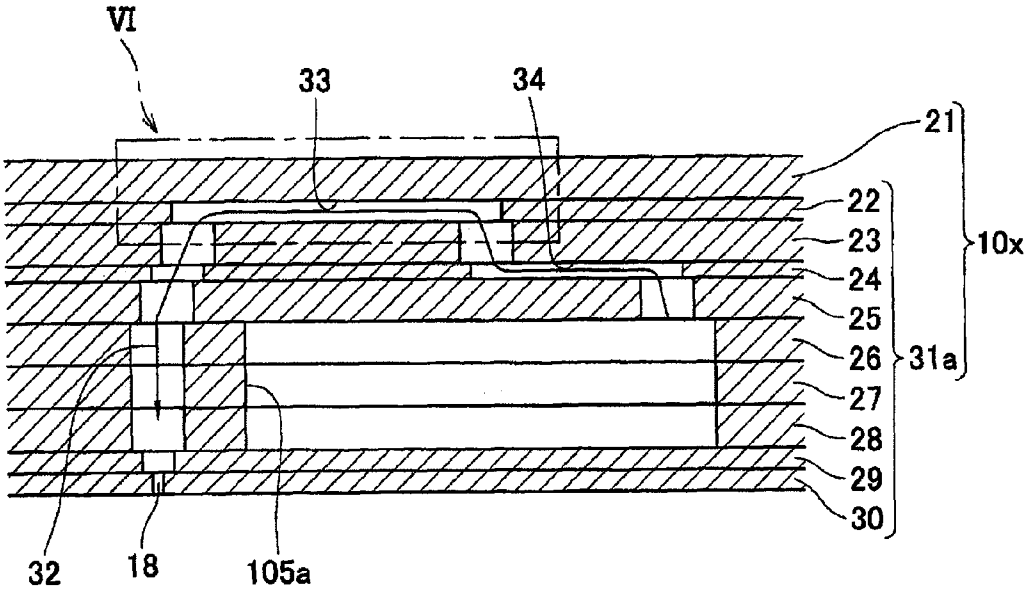
FIG. 5 is a sectional view taken on line V-V in FIG. 4.

The passage modules 31*a* and the actuator modules 21 are substantially the same in shape and dimensions in a plan view and are laminated and adhered together as pairs in a one-to-one relationship to make up one head module 10*x* (see FIG. 5). That is, the main head body 10*a* is arranged by assembling the eight, mutually-independent, head modules 10*x* on the substrate 31*b*. Hypotenuses of adjacent head modules 10*x* overlap with each other in the subscan direction.

The respective head modules 10*x* are disposed in a staggered manner (that is, in regard to the subscan direction, alternately and equidistantly biased in mutually parallel and mutually opposing outward directions with respect to a center of the head 10 in the subscan direction) at predetermined intervals along the main scan direction. Each head module 10*x* is disposed so that a portion corresponding to a lower base of the trapezoidal shape is positioned near an end of the head 10 in the subscan direction. Recording at a predetermined definition is thereby enabled across an entirety of the sheet P in the main scan direction.

The passage modules 31*a* and the actuator modules 21 making up the head modules 10*x* are respectively ranked and disposed at appropriate positions based on a magnitude of a resistance of individual ink passages 32 and a magnitude of a capacitance of actuators. This will be described in detail in the description of the method of manufacture below.

The reservoir unit 10*b* is laminated on an upper surface of the substrate 31*b* of the passage unit 31 and, together with the passage unit 31, sandwiches the actuator modules 21. That is, the reservoir unit 10*b* is fixed on an upper surface portion of the substrate 31*b* at which the head modules 10*x* are not disposed (a region including openings 105*b* and defined by alternate long and two short dashes lines in FIG. 3) and is disposed to oppose the actuator modules 21 across a minute interval.

As shown in FIG. 2, a joint 91 to which is fixed a tube connected to the main tank 121 and a joint 92 to which is fixed a tube connected to a waste liquid tank are provided on an upper surface of the reservoir unit 10*b*. The reservoir unit 10*b* temporarily stores ink supplied via the joint 91 from the main tank 121 and supplies the ink to passages in the passage unit 31 via the openings 105*b* (see FIG. 3). Also, during purging or other maintenance procedures that are performed for keeping the ejection performance of the head 10 satisfactory, the ink inside the reservoir unit 10*b* is ejected to the waste liquid tank via the joint 92.

Both the substrate 31*b* and the passage modules 31*a* of the passage unit 31 are arranged by mutually laminating and adhering together a plurality of plates having through holes so as to form passages in the respective insides.

In the substrate 31*b*, eight through holes having openings of trapezoidal shape are formed in a staggered manner at predetermined intervals in the main scan direction. On the upper surface of the substrate 31*b*, the openings 105*b* (see FIG. 3B) are formed in a manner avoiding the eight trapezoidal openings. A total of eighteen openings 105*b* formed in one substrate 31*b* form two columns along the main scan direction, with two openings 105*b* being formed at positions opposing an upper base of each trapezoidal opening and one opening 105*b* being formed at an end side of each of the openings, among the eight trapezoidal openings, disposed at respective ends in the main scan direction (that is, near respective ends in the main scan direction of the substrate 31*b*). Manifold passages 105 connected to the openings 105*b* are formed in the inside of the substrate 31*b*. Each manifold passage 105 is opened at one end so as to connect to sub manifold passages 105*a* formed in the passage modules 31*a*. The substrate 31*b* may be a laminate of a plurality of metal plates or an integrally molded object formed, for example, of resin or other material besides metal.

Figure 4:
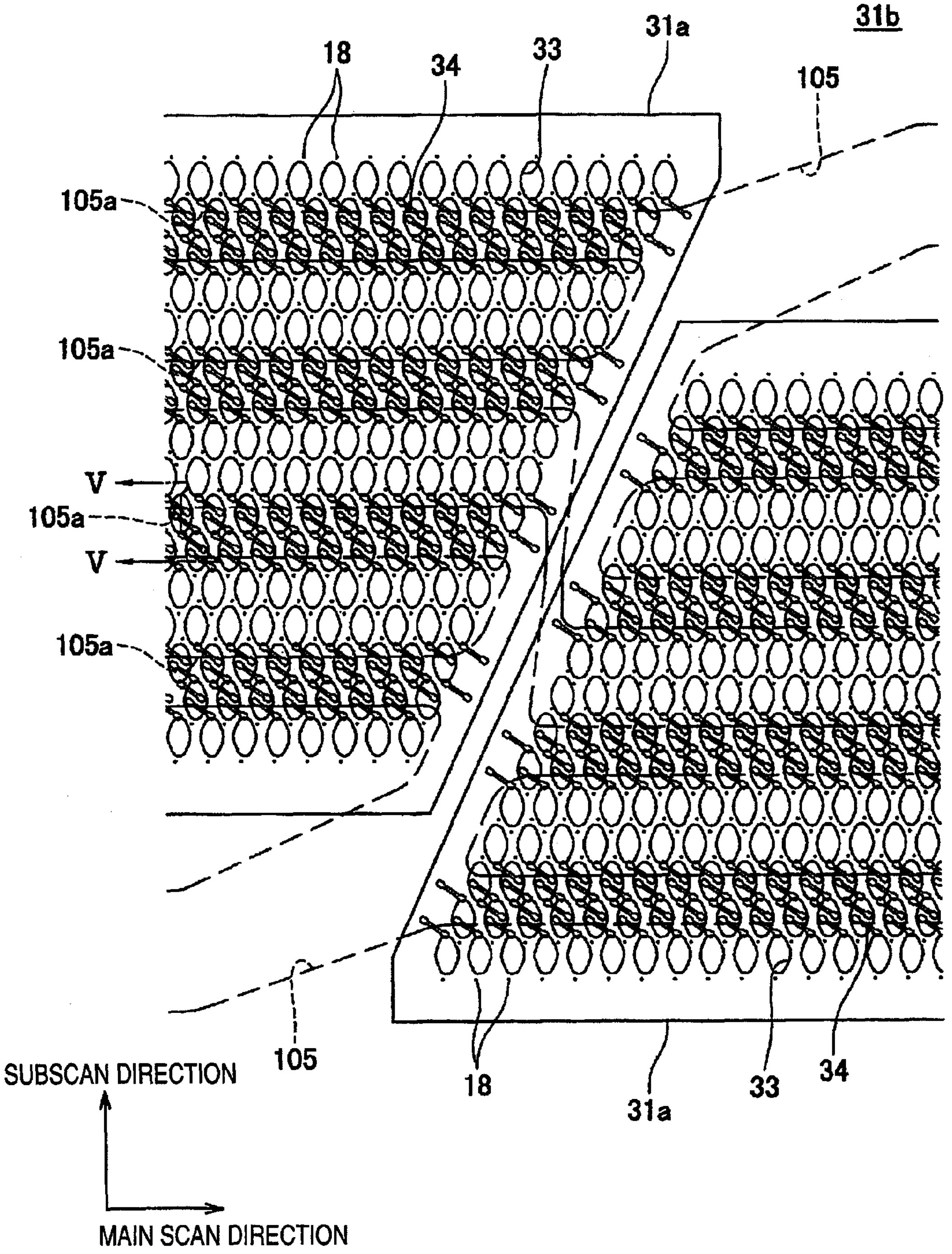
FIG. 4 is an enlarged view of a region surrounded by alternate long and short dash lines in FIG. 3.

As shown in FIG. 5, each passage module 31*a* includes nine metal plates 22, 23, 24, 25, 26, 27, 28, 29, and 30. As shown in FIG. 4, a plurality of (for example, 664) ejection ports 18 are formed in matrix form in a lower surface (ejection surface) of the passage module 31*a*. On the upper surface of the passage module 31*a*, that is, on the surface onto which the actuator module 21 is adhered, pressure chambers 33 corresponding to the respective ejection ports 18 are opened in the same matrix form as the ejection ports 18. In addition, in FIG. 4, the actuator modules 21 are omitted, and apertures 34 and the ejection ports 18, which are formed on the insides and the lower surfaces of the passage modules 31*a* and should conventionally be drawn with broken lines, are drawn with solid lines.

In each passage module 31*a*, four sub manifold passages 105*a* are formed extending in the main scan direction and the individual ink passages 32 branching from the sub manifold passages 105*a* (see FIG. 5). The individual ink passage 32 is formed for each ejection port 18 and refers to the passage leading from an exit of the sub manifold passage 105*a* (base end of an arrow indicating the individual ink passage 32 in FIG. 5) to the ejection port 18 via the aperture 34 serving as a throttle portion and the pressure chamber 33. The sub manifold passage 105*a* is opened at one end thereof so as to connect to the manifold passage 105 formed in the substrate 31*b*.

The pressure chambers 33 respectively have a substantially rhombic planar shape and, in one passage module 31*a*, form sixteen pressure chamber columns extending along the main scan direction (see FIG. 4). The pressure chamber columns extending in the main scan direction are aligned at predetermined intervals in the subscan direction and, in correspondence to the trapezoidal shape of the passage module 31*a*, the number of the pressure chambers 33 included in each column decreases as the upper base side is approached. A vicinity of an acute angle portion of the substantially rhombic shape of each pressure chamber 33 is sandwiched by the acute angle portions of two mutually adjacent pressure chambers 33 belonging to an adjacent column.

As with the pressure chambers 33, the ejection ports 18 form sixteen ejection port columns extending along the main scan direction. In plan view, two ejection port columns are each disposed with respect to one sub manifold passage 105*a*, that is, at respective sides in the width direction of one sub manifold passage 105*a*.

The aperture 34 is the portion of highest passage resistance in each individual ink passage 32 and has a function of adjusting a flow rate of ink supplied to the pressure chamber 33. Also, in the individual ink passage 32, the aperture 34 is the second smallest passage area next to the ejection port 18. For example, the ejection port 18 has an opening area of approximately 300 $\mu m^2$ (20 μmω), and the aperture 34 has a passage area of approximately 1200 $\mu m^2$ (60 μm×20 μm) and a length of approximately 300 μm.

As with the passage module 31*a*, the substrate 31*b* is formed from the metal plates 22 to 30 in the present embodiment, as shown in FIG. 5. A total thickness of the substrate 31*b* is thus the same as a total thickness of the passage module 31*a*. The openings 105*b* and the manifold passages 105 that are in communication therewith are formed in the substrate 31*b*. In the substrate 31*b*, at peripheral walls that define the trapezoidal openings (through holes) into which the passage modules 31*a* are assembled, protrusions (not shown) that support the passage modules 31*a* are formed so as to protrude into the openings, and the manifold passages 105 are opened at the one end connecting with the sub manifold passages 105*a*. Each passage module 31*a* has a connecting portion corresponding to the protrusion (for example, a recessed portion that engages with the protrusion), and is assembled into the opening of the substrate 31*b* so as to be supported via the connecting portion by the protrusion formed on the peripheral wall of the substrate 31*b*. In this state, one end of the sub manifold passage 105*a* in the passage module 31*a* opposes the one end of the manifold passage 105 opened in the peripheral wall of the substrate 31*b*, and the passages 105 and 105*a* are thereby put into communication with each other. Also, a lower surface of the substrate 31*b* is at the same height as the ejection surface (lower surface) of the passage module 31*a*.

Figure 6A:
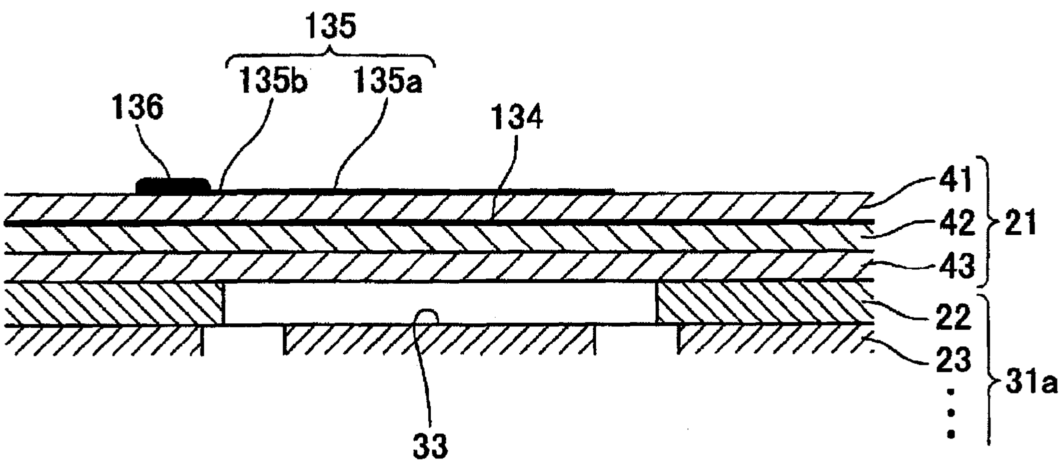
FIG. 6A is an enlarged view of a region surrounded by alternate long and short dash lines in FIG. 5.

As shown in FIG. 6A, each actuator module 21 includes: three mutually laminated piezoelectric ceramic layers 41, 42, and 43; individual electrodes 135 formed on an upper surface of the uppermost piezoelectric ceramic layer 41 in correspondence to the respective pressure chambers 33; individual lands 136 electrically connected to the individual electrodes 135; and an internal common electrode 134 formed across an entire surface between the piezoelectric ceramic layer 41 and the piezoelectric ceramic layer 42 at the lower side. An electrode is not disposed between the piezoelectric ceramic layer 42 and the piezoelectric ceramic layer 43. The piezoelectric ceramic layers 41 to 43 are all formed of a lead zirconate titanate (PZT) based ceramic material having a ferroelectric property, and each has a thickness of approximately 15 μm and a trapezoidal shape that defines an outer shape of the actuator module 21.

Figure 6B:
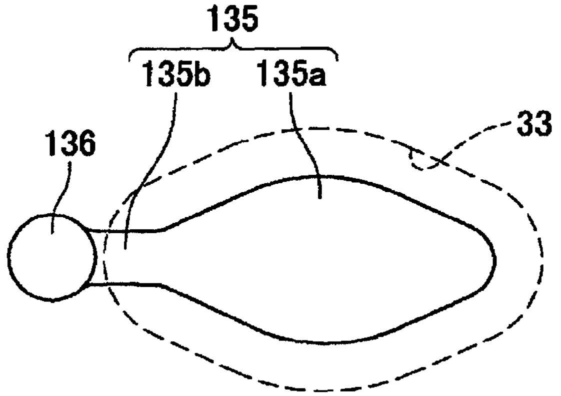
FIG. 6B is a plan view of an individual electrode.

As shown in FIG. 6B, each individual electrode 135 includes: a main electrode portion 135*a* with a substantially rhombic planar shape; an extended portion 135*b* extending from an acute angle portion at one side of the main electrode portion 135*a*; and the individual land 136 formed at a tip of the extended portion 135*b*. The main electrode portion 135*a* is substantially homothetic to the pressure chamber 33 and slightly smaller than the pressure chamber 33 in size. The main electrode portion 135*a* is disposed opposite the pressure chamber 33 in regard to the lamination direction of the piezoelectric ceramic layers 41, 42, and 43, and the extended portion 135*b* extends in a planar direction and outside the region opposing the pressure chamber 33. In regard to the lamination direction, the individual land 136 is disposed opposite the wall defining the pressure chamber 33 in the metal plate 22 and has a height of approximately 10 μm. A land for the common electrode is also disposed on a top surface of the piezoelectric ceramic layer 41 and is made continuous to the internal common electrode 134 via a through hole. The common electrode land has the same size and shape as the individual land 136.

Active portions of the piezoelectric ceramic layer 41 that are sandwiched by the respective individual electrodes 135 and the internal common electrode 134 function as the actuators that apply pressure to the ink inside the pressure chambers 33. That is, in each actuator module 21, the number of actuators equals the number of pressure chambers 33 formed in the passage module 31*a*, and the actuators are respectively formed so as to oppose the pressure chambers 33 in regard to the direction of lamination of the plate 22, etc.

One end of a flexible printed circuit board (FPC) 80, shown in FIG. 2, is connected to the individual lands 136 and the common electrode land of each actuator module 21. The FPC 80 is lead out upward from between the passage unit 31 and the reservoir unit 10*b* and is connected to a control circuit board (not shown) at the other end. A driver IC 81 is mounted at an intermediate portion of the FPC 80 between the actuator module 21 and the control circuit board. FPC 80 transmits the image signal output from the control circuit board to the driver IC 81, a drive voltage output from the driver IC 81 is supplied to the actuator module 21. The reservoir unit 10*b* and the passage module 31*a* are thermally coupled to the driver IC 81 via the FPC 80. As shown in FIG. 2, one driver IC 81 is provided in each single FPC 80.

The ink supplied from the reservoir unit 10*b* into the passage unit 31 via the openings 105*b* passes through the manifold passages 105 inside the substrate 31*b* and flows into the respective individual ink passages 32 via the sub manifold passages 105*a* in the respective passage modules 31*a*. When the actuator modules 21 are then driven in accordance with the drive voltages from the driver ICs 81 under the control of the controller 100 (see FIG. 1), pressure is applied to the ink in the pressure chambers 33 in accordance with volume changes in the pressure chambers 33 and the ink is ejected from the corresponding ejection ports 18.

A method of manufacturing the printer 1 shall now be described with reference to FIG. 7.

Figure 8:
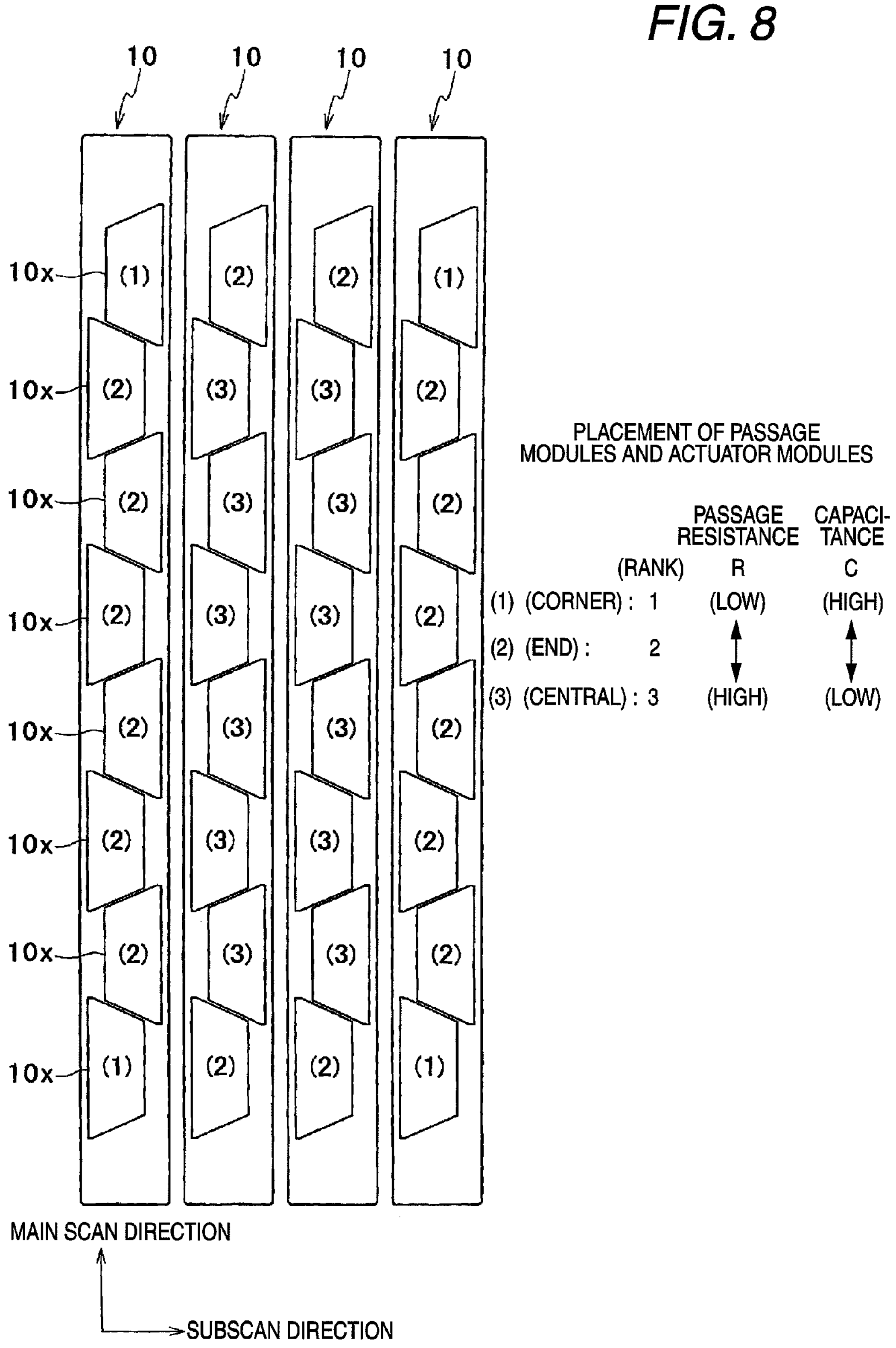
FIG. 8 is an explanatory diagram of a placement of passage modules and actuator modules.

First, before preparing the passage modules 31*a* and the actuator modules 21, the passage modules 31*a* (the head modules 10*x* also including the actuator modules 21) are classified into respective region groups (1), (2), and (3) in accordance with placement regions as shown in FIG. 8 (S0). FIG. 8 is an explanatory diagram of a placement of the passage modules 31*a* and the actuator modules 21, and schematically shows the placement regions of the head modules 10$x$ in the respective passage units 31 of the four heads 10, which are aligned in parallel in the sub scan direction. In the present embodiment, the placement regions of the passage modules 31$a$ (the head modules 10$x$ also including the actuator modules 21) are classified into the three region groups of: (1) a corner region group; (2) an end region group; and (3) a central region group.

Figure 7:
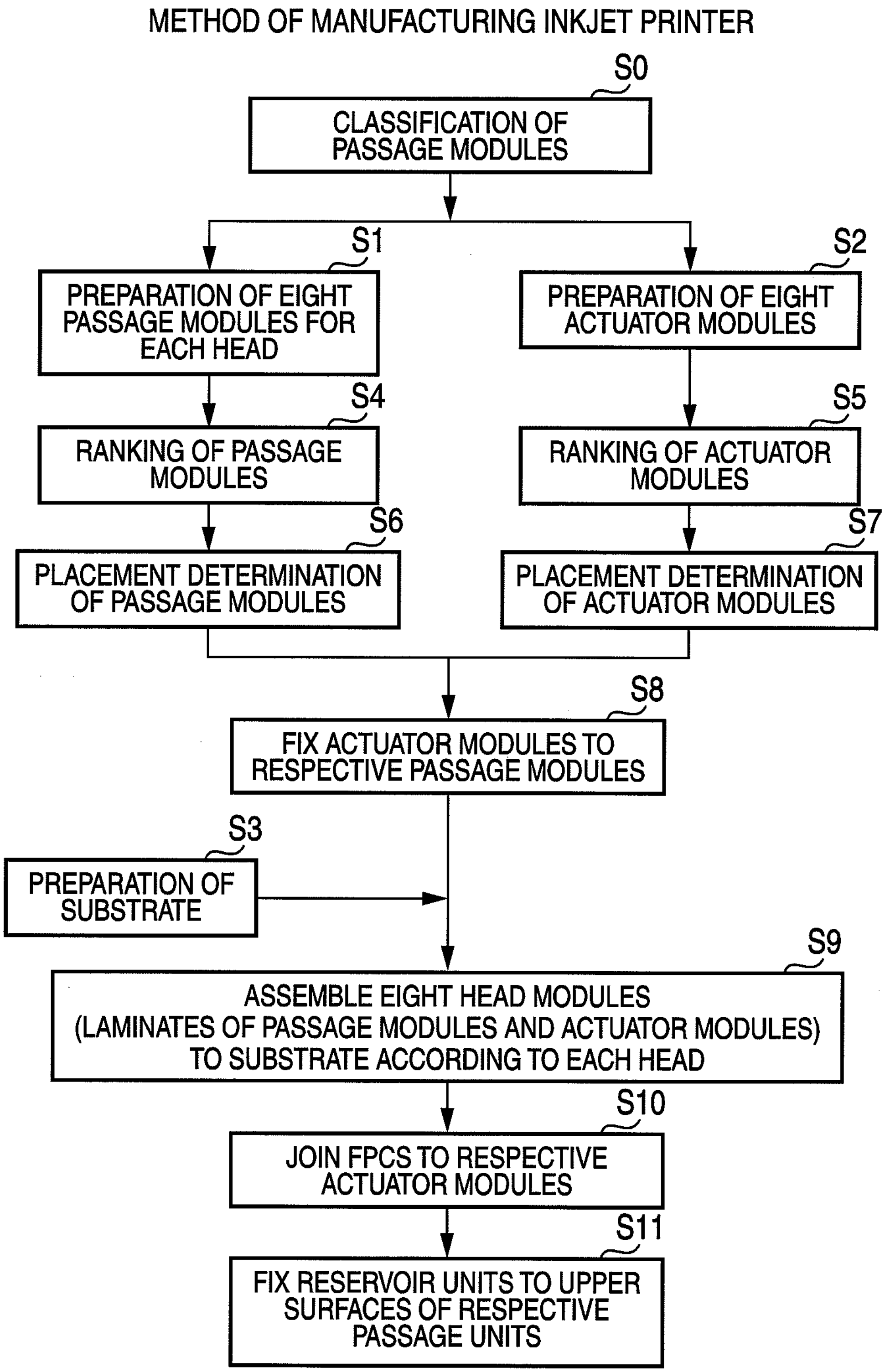
FIG. 7 is a process diagram of a method of manufacturing an inkjet printer.

Thereafter, for each single head 10, eight of each of the passage modules 31$a$ and the actuator modules 21 that make up the head modules 10$x$ are prepared separately from each other (S1 and S2 of FIG. 7). Further, the substrate 31$b$ that houses the head modules 10$x$ is also prepared (S3 of FIG. 7). The preparation of the passage modules (S1), the preparation of the actuator modules (S2), and the preparation of the substrate 31$b$ (S3) are each performed independently and any of these may be performed before the others or may be performed in parallel.

In the passage module preparation step (S1), first, etching using a patterned photoresist as a mask is applied respectively to nine metal plates, made of stainless steel, etc., to form holes and thereby prepare the plates 22 to 30 that make up the passage modules 31$a$ (see FIG. 5). Thereafter, the plates 22 to 30 are laminated via an adhesive so as to form the individual ink passages 32 and then pressurized while heating. The adhesive is thereby hardened so that the plates 22 to 30 are fixed to each other and the passage module 31$a$ is completed. As the adhesive for this step, a thermosetting, epoxy-based adhesive is used.

Before joining the plates 22 to 30 in S1, several parameters are measured. These parameters are used in computing magnitudes of passage resistances in a ranking step (S4) to be performed later. In the present embodiment, only a portion of individual ink passages 32 (for example, 90 randomly extracted passages) among the plurality of (for example, 664) individual ink passages 32 included in each passage module 31$a$ are used in the measurement of the parameters. Also, dimensions of the ejection ports 18 and the apertures 34, which are the portions in the individual ink passages 32 that have large influences on the passage resistance, are measured. Here, the dimensions of the ejection ports 18 and the apertures 34 refer to a diameter of a hole making up the ejection port 18, a width and length of a groove making up the aperture 34, and thicknesses of the plates 30 and 24 in which the holes and grooves are formed, for example.

In the actuator module preparation step (S2), first, three green sheets, which are to become the piezoelectric ceramic layers 41 to 43 (see FIG. 6A), are prepared for each actuator module 21. An Ag—Pd-based conductive paste is then screen printed respectively in a pattern of the individual electrodes 135 on the green sheet that is to become the piezoelectric ceramic layers 41 and in a pattern of the internal common electrode 134 on the green sheet that is to become the piezoelectric ceramic layer 42. Thereafter, while positioning using a jig, the green sheet that is to become the piezoelectric ceramic layer 42 is overlapped, with the surface having the internal common electrode 134 printed thereon facing up, onto the piezoelectric ceramic layer 43, on which printing has not been performed, and the piezoelectric ceramic layer 41 is overlapped further above with the surface having the individual electrodes 135 printed thereon faced up. The laminate of the green sheets is then degreased in the same manner as known ceramics and baked at a predetermined temperature. Thereafter, an Au-based conductive paste, which contains a glass frit and is to become the individual lands 136, is printed onto the extended portions 135$b$ of the respective individual electrodes 135. The common electrode land is also printed in likewise manner at this time. Each actuator module 21 is thereby completed.

In the substrate preparation step (S3), nine metal plates are prepared as in the passage module preparation step (S1). An etching process using a patterned photoresist as a mask is then applied to the respective plates. Thereafter, the respective plates are laminated via an adhesive so that the holes formed by the etching are put in communication with each other and then plates are heated and pressurized. The respective plates are thereby fixed to each other and the substrate 31$b$, having the ink passages continuing from the openings 105$b$ to the manifolds 105 formed in the inside, is thereby completed. The respective plates used in the substrate preparation step (S3) have the same material quality and thickness as the plates used in the passage module preparation step (S1) and the same thermosetting adhesive is also used as the adhesive.

After eight of each of the passage modules 31$a$ and the actuator modules 21 that make up on the head 10 have thus been separately prepared, the modules are ranked (S4 and S5). As with steps S1, S2, and S3, the ranking of the passage modules (S4) and the ranking of the actuator modules (S5) are performed independently of each other and either may be performed before the other or both may be performed in parallel.

Figure 9:
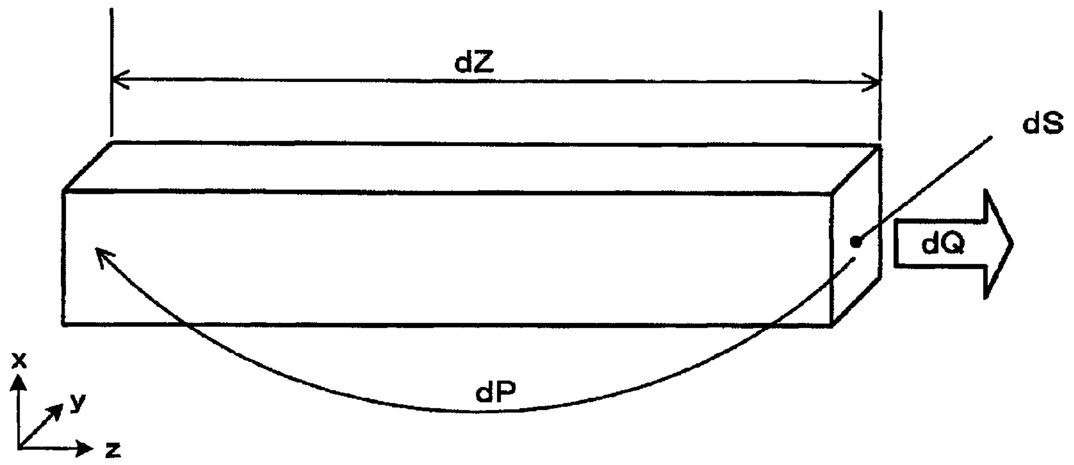
FIG. 9 is a schematic view for explaining a passage resistance computing formula used in ranking the passage modules.

The ranking of the passage modules (S4) is performed based on the magnitude of the passage resistance of the individual ink passages 32 (see FIG. 5) included in the passage modules 31$a$. In the present embodiment, the following Formulae (1), (2), and (3), based on the schematic diagram of FIG. 9, are used to compute the passage resistance with the dimensions of the ejection ports 18 and the apertures 34 of the portion of the individual ink passages 32 of each passage module 31$a$ that were measured before joining the plates 22 to 30 in S1 as parameters. In Formulae (1) to (3), μ is a viscosity coefficient of the ink, R is the passage resistance, dS is a passage cross-sectional area, dZ is a passage length, dP is a pressure difference between respective ends of the passage, dQ is a volumetric flow rate of the ink in a hypothetical passage tube of FIG. 9, and w is a flow speed in a z direction of the ink in the hypothetical tube. The viscosity coefficient (μ) of the ink is determined by the type of ink used in the head 10. The passage cross-sectional area (dS) is determined by the hole diameter in the ejection port 18, and by the width of the groove and the thickness of the plate 24 in the aperture 34. The passage length (dZ) is determined by the thickness of the plate 30 in the ejection port 18, and by the length of the groove in the aperture 34. Finite element analysis, etc., may be performed to obtain values with high precision.

Formula 1

$$\frac{\partial^2 w}{\partial x^2} + \frac{\partial^2 w}{\partial y^2} = -\frac{1}{\mu} \cdot \frac{\partial P}{\partial Z} \tag{1}$$

$$dQ = \int w\,dS \tag{2}$$

$$R = \frac{dP}{dQ} \tag{3}$$

The passage resistances of the ejection port 18 and the aperture 34 computed as described above are synthesized as the passage resistance of the corresponding individual ink passage 32, and the passage resistance of each of the 90 individual ink passages 32 are thereby determined. Further, an average value of the passage resistances of the 90 individual ink passages 32 is determined as the passage resistance of the individual ink passages 32 in the corresponding passage module 31*a*.

Then, based on the magnitude of the passage resistance of the individual ink passages 32, the respective passage modules 31*a* (see FIG. 3) are ranked successively starting from those of lower passage resistance into the three ranks of first, second and third ranks (S4). Specifically, lower limit values L2 and L3 (L2<L3) are set for the second and third ranks, and the passage modules 31*a* with which the passage resistance of the individual ink passages 32 is less than L2 are ranked in the first rank, those with which the passage resistance is not less than L2 but less than L3 are ranked in the second rank, and those with which the passage resistance is not less than L3 are ranked in the third rank.

The ranking of the actuator modules (S5) is performed based on the magnitude of the capacitance of the actuators (active portions of the piezoelectric ceramic layer 41 sandwiched by the respective individual electrodes 135 and the internal common electrode 134) included in each actuator module 21. In the present embodiment, as in the above-described ranking of the passage modules 31*a*, in computing the capacitance, only a portion of the actuators (for example, 90 randomly extracted actuators) among the plurality of (for example, 664) actuators included in each actuator module 21 are used. The 90 actuators used here respectively correspond to the 90 individual ink passages 32 extracted in the ranking of the passage modules 31*a* (S4) (that is, the actuators that oppose the pressure chambers 33 in the corresponding individual ink passages 32 and apply pressure to the ink in the pressure chambers 33). Also, as shown in FIG. 7, in step S5, the actuator modules 21 are in a state of not being fixed to the passage modules 31*a*.

Figure 10:
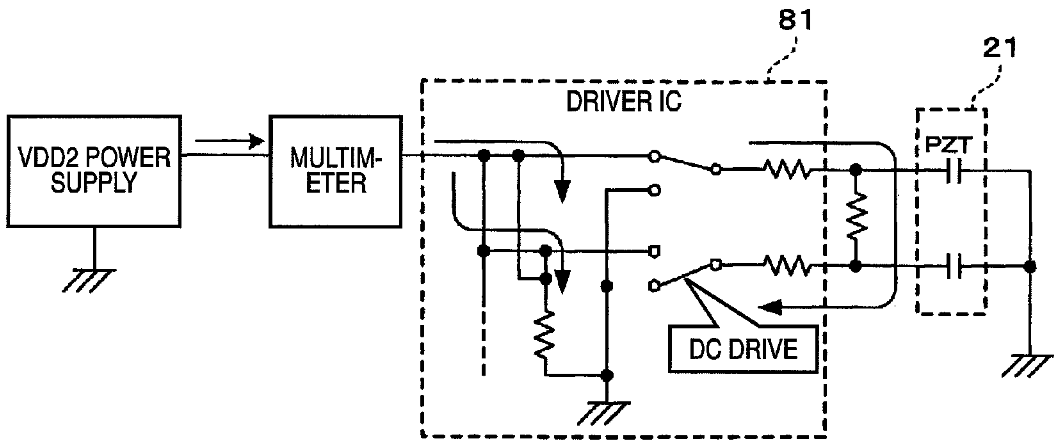
FIG. 10 is a schematic view of a measurement circuit for measuring a capacitance of an actuator in an actuator module.

First, a measurement circuit such as shown in FIG. 10 is set up for each actuator module 21 and measurements are made. A pulse voltage is applied to the actuator being measured and the capacitance is determined from a charge-discharge current that is generated in this process. Specifically, charging and discharging of the actuator are repeated by successively driving one-by-one each of the 90 actuators included in the actuator module 21 with a pulse voltage of 20 kHz frequency. A supply current $I_1$ from a VDD2 power supply in this process is measured. Actuators besides the measured actuator are held at a ground potential during this process. Further, the 90 actuators are successively driven one-by-one by a DC voltage, and a supply current $I_2$ from the VDD2 power supply in this process is measured. The values $I_1$ and $I_2$, a voltage V of the VDD2 power supply, and the drive frequency F are then used to compute the capacitance C according to the following Formula (4).

Formula 2

$$C = \frac{I_1 - I_2}{V \cdot F} \quad (4)$$

$$\left[\begin{array}{ll} C = \frac{Q}{V} = \frac{I}{V \cdot F} & (5) \\ I_1 = I_{L1D} + I_{L1CH} + I & (6) \\ I_2 = I_{L2D} + I_{L2CH} & (7) \\ I_{L1D} \approx I_{L2D} & (8) \\ L_{L1CH} \approx I_{L2CH} & (9) \end{array}\right]$$

Formula (4) is obtained from Formulae (5), (6), (7), (8), and (9). In Formulae (5) to (9), Q is a charge, I is the charge-discharge current, $I_{L1D}$ is an internal leak current of the driver IC 81 during the pulse voltage drive, $I_{L1CH}$ is a leak current between adjacent actuators during the pulse voltage drive, $I_{L2D}$ is an internal leak current of the driver IC 81 during the DC voltage drive, and $I_{L2CH}$ is a leak current between adjacent actuators during the DC voltage drive.

Further, for each single actuator module 21, an average value of the capacitances of the 90 actuators is determined as the capacitance of the actuators in the actuator module 21. Then, based on the magnitude of the capacitance of the actuators, the respective actuator modules 21 (see FIG. 3) are ranked successively starting from those of higher capacitance into the three ranks of first, second and third ranks (S5). Specifically, lower limit values A1 and A2 (A1>A2) are set for the first and second ranks, and the actuator modules 21 with which the capacitance of the actuators is not less than A1 are ranked in the first rank, those with which the capacitance is not less than A2 but less than A1 are ranked in the second rank, and those with which the capacitance is less than A2 are ranked in the third rank.

Thereafter, the respective placements of the passage modules 31*a* and the actuator modules 21 ranked in S4 and S5 are determined so as to be in a correspondence relationship shown at a right side of FIG. 8 (S6 and S7). As with steps S1, S2, and S3, S6 and S7 are performed independently of each other and either may be performed before the other or both may be performed in parallel.

In the present embodiment, the passage modules 31*a* ranked in the first rank (rank of lowest passage resistance) and the actuator modules 21 ranked in the first rank (rank of highest capacitance) are placed in the regions classified as belonging to the (1) corner region group, the passage modules 31*a* ranked in the second rank (rank of intermediate passage resistance) and the actuator modules 21 ranked in the second rank (rank of intermediate capacitance) are placed in the regions classified as belonging to the (2) end region group, and the passage modules 31*a* ranked in the third rank (rank of highest passage resistance) and the actuator modules 21 ranked in the third rank (rank of lowest capacitance) are placed in the regions classified as belonging to the (3) central region group.

The classification of the passage modules 31*a* (the head modules 10*x* also including the actuator modules 21) into the respective region groups (1), (2), and (3) (S0) is performed before S1 and S2, due to the predetermined number of regions in each region group, the ranking in each of S4 and S5 is preferably performed according to the number of regions in each region group. In the present embodiment, the passage modules 31*a* and the actuator modules 21 are respectively ranked so that four of each are ranked in the first rank, sixteen of each are ranked in the second rank, and twelve of each are ranked in the third rank. One each of the passage module 31*a* and the actuator module 21 is placed in each placement region of the head module 10*x*.

After S6 and S7, the passage modules 31*a* and the actuator modules 21 determined to be placed in the same region are fixed to each other using a thermosetting adhesive, for example, (S8).

Then, in each head 10, the eight head modules 10*x* (the laminates of the passage module 31*a* and the actuator module 21) prepared in S8 are assembled by a suitable adhesive, etc., into the trapezoidal openings formed in the substrate 31*b* of the passage unit 31 (S9). The main head body 10*a* is thereby completed.

Thereafter, one end of the FPC 80 (see FIG. 2) is bonded to each actuator module 21 by coating the conductive adhesive onto the individual lands 136 and the common electrode land, etc., (S10). Further thereafter, in each head 10, the reservoir unit 10*b* (see FIG. 2) is fixed to the upper surface of the passage unit 31 (S11). The four heads 10 are thereby completed. By then carrying out a step of placing the four heads 10 thus manufactured inside the casing 1*a* and fixing the heads to the frame 3, etc., the printer 1 is completed. The driver ICs 81 are mounted to the FPCs 80 in advance in a separate step.

The method of manufacturing the head 10, the method of manufacturing the printer 1, the head 10, and the printer 1 according to the present embodiment described above take note of heat being retained more and the temperature tending to be higher closer to the center in one head 10 or the printer 1 and of the capacitance of the actuators having an influence on an amount of heat generation occurring at the driver IC 81. When the capacitance of the actuators is high, the amount of heat generated from the driver IC 81 is high. Thus, by combining the passage module 31*a* at a position that is cooled readily with the actuator module 21 of high capacitance (with which the amount of heat generated from the driver IC 81 is high in this case) as described above, the making of the fluidity of the ink uniform is promoted especially in low temperature states. Further, by making the actuator modules 21 correspond to the passage modules 31*a* of an appropriate region group based on the magnitude of the capacitance (see S4, S5, S6, and S7 of FIG. 7 and see FIG. 8), the fluidity of the ink can be made uniform and recording of good quality can be realized either within the passages of one head 10 and among the four heads 10 included in one printer 1, or both, even in a case of using an ink of comparatively high viscosity.

Also, in the method of manufacturing according to the present embodiment, not only the ranking of the actuator modules 21 is performed (S5) but the ranking of the passage modules 31*a* is also performed as described above (S4) due to the passage resistance of the individual ink passages 32 having an influence on the fluidity of the ink. When the passage resistance is high, the fluidity of the ink is low. Thus, as described above, by placing the passage modules 31*a* having passages with which the fluidity of ink is low at the positions at which heat tends to be retained, lowering of the fluidity of ink can be suppressed especially in low temperature states. Further, by placing the ranked passage modules 31*a* so as to be classified in the appropriate region groups (see S6 of FIG. 7 and see FIG. 8), the uniformity of the fluidity of the ink is realized more reliably.

In the passage module ranking step (S4), the dimensions of the ejection port 18 and the aperture 34 are used as factors of the passage resistance related to the ranking. In this case, the ranking can be performed more appropriately because the ejection port 18 and the aperture 34 are the portions that have large influences on the passage resistance.

In the passage module ranking step (S4), the ranking of the passage modules 31*a* is performed based on the passage resistance of a portion of the plurality of individual ink passages 32 in each passage module 31*a* (for example, 90 individual ink passages among the total of 664). In this case, the step can be performed more efficiently in comparison to a case of performing the ranking based on the passage resistance of all of the individual ink passages 32 in each passage module 31*a*.

Likewise, in the actuator module ranking step (S5), the ranking of the actuator modules 21 is performed based on the capacitance of a portion of the plurality of actuators in each of the actuator modules 21 (for example, 90 actuators among the total of 664). In this case, the step can be performed more efficiently in comparison to the case of performing the ranking based on the capacitance of all of the actuators in each actuator module 21.

Further, the portion of the actuators used in the actuator module ranking step (S5) correspond to the portion of the individual ink passages 32 (that is, the 90 randomly extracted individual ink passages 32) in each passage module 31*a* used in the passage module ranking step (S4). In a case of using the individual ink passages 32 and the actuators that do not correspond to each other in each of S4 and S5, there arises a problem that ranking cannot be performed appropriately due to influence of variations in the magnitudes of the passage resistance and the capacitance within each of the modules 31*a* and 21. Meanwhile, with the above configuration, this problem is alleviated and the ranking precision is improved.

The passage unit preparation step (corresponding to step S9 of FIG. 7), in which the eight passage modules 31*a*, made up of mutually independent members, are assembled onto the one substrate 31*b* to prepare the passage unit 31 that includes the eight passage modules 31*a*, is included. In other words, the head 10 includes the passage unit 31 that includes the eight passage modules 31*a*, made up of mutually independent members, and the one substrate 31*b*, onto which the eight passage modules 31*a* are assembled. The passage module ranking step (S4) is thereby facilitated. Further, the fluidity of the ink can readily be made the same among the passage modules 31*a*, and the passage unit 31 without variation in the fluidity of the ink (that is, with which the ink fluidity is made uniform) can be readily prepared.

As shown in FIGS. 2 and 3, one IC driver 81 is provided for each of the eight actuator modules 21. In this case, the actuator modules 21 and the drive ICs 81 are put in a one-to-one relationship, and thus the effect of making uniform the fluidity of the ink by performing the actuator module ranking step (S5) is realized even more reliably.

With each head 10, the passage modules 31*a* and the actuator modules 21 are respectively aligned along the longitudinal direction of the head 10 and the eight driver ICs 81 are aligned along the longitudinal direction of the head 10 so as to respectively correspond to the passage modules 31*a*. In this case, variation of temperature along the longitudinal direction of the head 10 can be suppressed to realize uniformity of the fluidity of the ink even in a case where the head 10 is long in one direction, as in a line type head.

In each of the passage module ranking step (S4) and the actuator module ranking step (S5), ranking into three ranks is performed (see FIG. 8). In this case, in comparison to a case, for example, of ranking into two ranks, a more appropriate placement of the actuator modules 21 is realized and the effect of making uniform the fluidity of the ink can be obtained even more reliably.

Figure 11A:
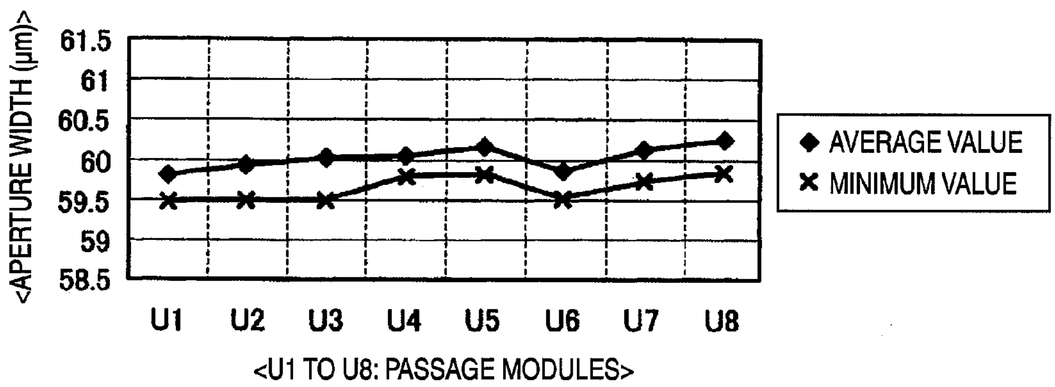
FIG. 11A is a graph of measurement values of widths of apertures in each of eight passage modules.
Figure 11B:
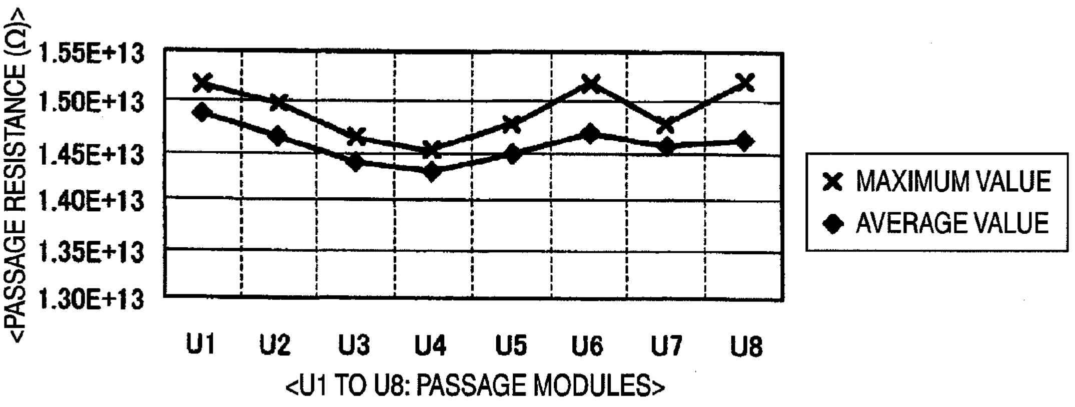
FIG. 11B is a graph of computed values of the passage resistances of the aperture portions in each of the eight passage modules.

In the present invention, the actuator modules are ranked (S5) and fixed at appropriate positions as described above under the premise that there are differences in the capacitance of the actuators among the plurality of actuator modules. Yet further in the embodiment described above, the passage modules are ranked (S3) and fixed at appropriate positions as described above under the premise that there are differences in the passage resistance of the individual ink passages among the plurality of passage modules. In regard to this, actually measured values (average values (respectively obtained by determining the average for the apertures 34 of 90 individual ink passages among the 664 individual ink passages included in the one passage module 31*a*) and minimum values) of the width (design value: 60 μm) of the groove making up the aperture 34 are shown in FIG. 11A for the respective passage modules 31*a* in the case where eight passage modules 31*a* are included in one head 10 as in the above-described embodiment. From this figure, it can be understood that there is variation in the width of the aperture 34 among the eight passage modules 31*a*, as well as variation in the width among the apertures 34 in the one passage module 31*a*. Such variations arise due to dimensions of the base material, etching and other manufacturing processes, etc. Also, variations in the passage resistance arise due to such variations in the dimensions. Also, FIG. 11B is a graph of results of using the Formulae (1) to (3) to compute the passage resistances (average values and maximum values) of the aperture 34 portions of the respective passage modules 31*a* on the basis of the graph of FIG. 11A. From this figure, it can be understood that there is variation in the passage resistance of the aperture 34 portion among the eight passage modules 31*a* as well as variation in the passage resistance among the apertures 34 in the one passage module 31*a*.

Drive control of the head 10 shall now be described. When the printer 1 starts the drive in forming an image, an air flow arises inside the casing 1*a* with the traveling of the conveyor belt 8. At this time, the respective end sides in the main scan direction in one head 10 and the respective end sides in the subscan direction in the entirety of the four heads are more readily cooled. Thus, as shown in FIG. 8, in the present embodiment, the head modules 10*x* of the (1) corner region group are made up of the passage modules 31*a* of low passage resistance and the actuator modules 21 of high capacitance, the (2) end region group is made up of the passage modules 31*a* of intermediate passage resistance and the actuator modules 21 of intermediate capacitance, and the head modules 10*x* of the (3) central region group are made up of the passage modules 31*a* of high passage resistance and the actuator modules 21 of low capacitance. A large difference in fluidity of the ink is thereby prevented from occurring in the four heads 10 as a whole regardless of the positions of the head modules 10*x*. Also, when the drive time of the head 10 becomes long, heat becomes readily retained especially in the (3) central region group and the temperature of this portion tends to become high readily in comparison to other positions due to the heat generation from the driver ICs 81. However, with the present embodiment, even in such a case, heat is not retained readily at the (3) central region group and a large difference in fluidity of the ink is thereby prevented from occurring in the four heads 10 as a whole regardless of the positions of the head modules 10*x* because the head modules 10*x* of the (3) central region group are made up of the passage modules 31*a* of high passage resistance and the actuator modules 21 of low capacitance (in this case, the heat generation amounts of the driver ICs 81 are low). Here, the drive control of the head 10 is preferably performed as follows to further promote uniformity of the fluidity of the ink.

That is, the heat generation amount of the driver IC 81 resulting from the driving of the actuators is utilized by adjusting at least one of: the drive voltage supplied from the driver IC 81 to the actuator module 21, an application time of a single pulse supplied to the driver IC 81, and a total application time of pulses, to make the heat generation amount of the driver IC 81 higher at end portions (for example, at the (1) corner regions and the (2) end regions of FIG. 8) than at a center (for example, the (3) central region of FIG. 8) in one head 10 or the printer 1 at which heat tends to be retained. Such drive adjustment is preferably performed in a case where variation in temperature occurs within the head 10 or within the printer 1 even upon respectively ranking and placing the passage modules 31*a* and the actuator modules 21 at appropriate positions as in the above-described embodiment. In regard to the control of the printer 1, the drive may be adjusted as described above by taking into consideration only the making of the temperature uniform among the four heads 10 included in the printer 1 and without taking into consideration the making of the temperature inside the one head 10 uniform (that is, without providing a difference in the drive voltage, etc., supplied to the respective actuator modules 21 in the one head 10) or the drive may be adjusted by taking both the making of the temperature uniform within the one head 10 and the making of the temperature uniform among the four heads 10 into consideration.

To increase the heat generation amount arising in the driver IC 81, it is effective to perform so-called non-ejection flushing (adjusting the magnitude of the drive voltage from the driver IC 81, the application time of a single pulse supplied to the driver IC 81, the pulse width, etc., to drive the driver IC 81 without making ink be ejected from the ejection port 18).

By such a control method, the fluidity of ink can be made uniform either within one head 10 or among the plurality of heads 10 included in one printer 1, or both.

Although a preferred embodiment of the present invention has been described above, the present invention is not restricted to the above-described embodiment, and various design changes are possible within the scope described by the claims.

For example, although the actuator module includes piezoelectric type actuators in the above-described embodiment, the actuator module is not limited thereto and may instead include electrostatic or other type of actuators.

Although prepared by laminating a plurality of plates having holes formed by etching in the above-described embodiment, the passage module is not restricted thereto and may have holes formed by a method other than etching and is also not restricted to a plate lamination structure.

The portions of the individual ink passages 32 and the actuators used in the ranking steps (S4 and S5) do not have to correspond to each other.

In regard to the ranking steps (S4 and S5), although only 90 each of the ink passages 32 and the actuators, which represent only portions of the total of 664 respectively, are used in the embodiment described above, these numerical values are only an example and can be changed as suited. Also, the ranking steps may be performed not just based on portions as in the above case but may be performed based on all of the individual ink passages 32 in the passage module 31*a* or based on all of the actuators in the actuator module 21.

Although the dimensions of the ejection port 18 and the aperture 34 are used as factors of the passage resistance in the passage module ranking step (S4) in the above-described embodiment, the present invention is not restricted thereto, and the dimension of either the ejection port 18 or the aperture 34 may be used or a suitable portion in the individual ink passage 32 may be used as a factor of the passage resistance. Also, the passage resistance may be computed not based on a specific portion in the individual ink passage 32 but on an overall configuration of the individual ink passage 32.

In the method of manufacturing according to the present invention, the ranking (S4) and the determination of placements based on the ranking (S6) of the passage modules 31*a* are not essential requirements. Also, differing of the ranks of the passage resistances of the passage modules 31*a* according to the region groups (1), (2), and (3) in the liquid ejection head according to the present invention is not an essential requirement. That is, it suffices that the ranking (S5) and the determination of placements based on the ranking (S7) of the actuator modules 21 be performed even if ranking is not performed for the passage modules 31*a* and the ranks of the passage resistances of the passage modules 31*a* do not differ according to the region groups (1), (2), and (3).

Figure 15:
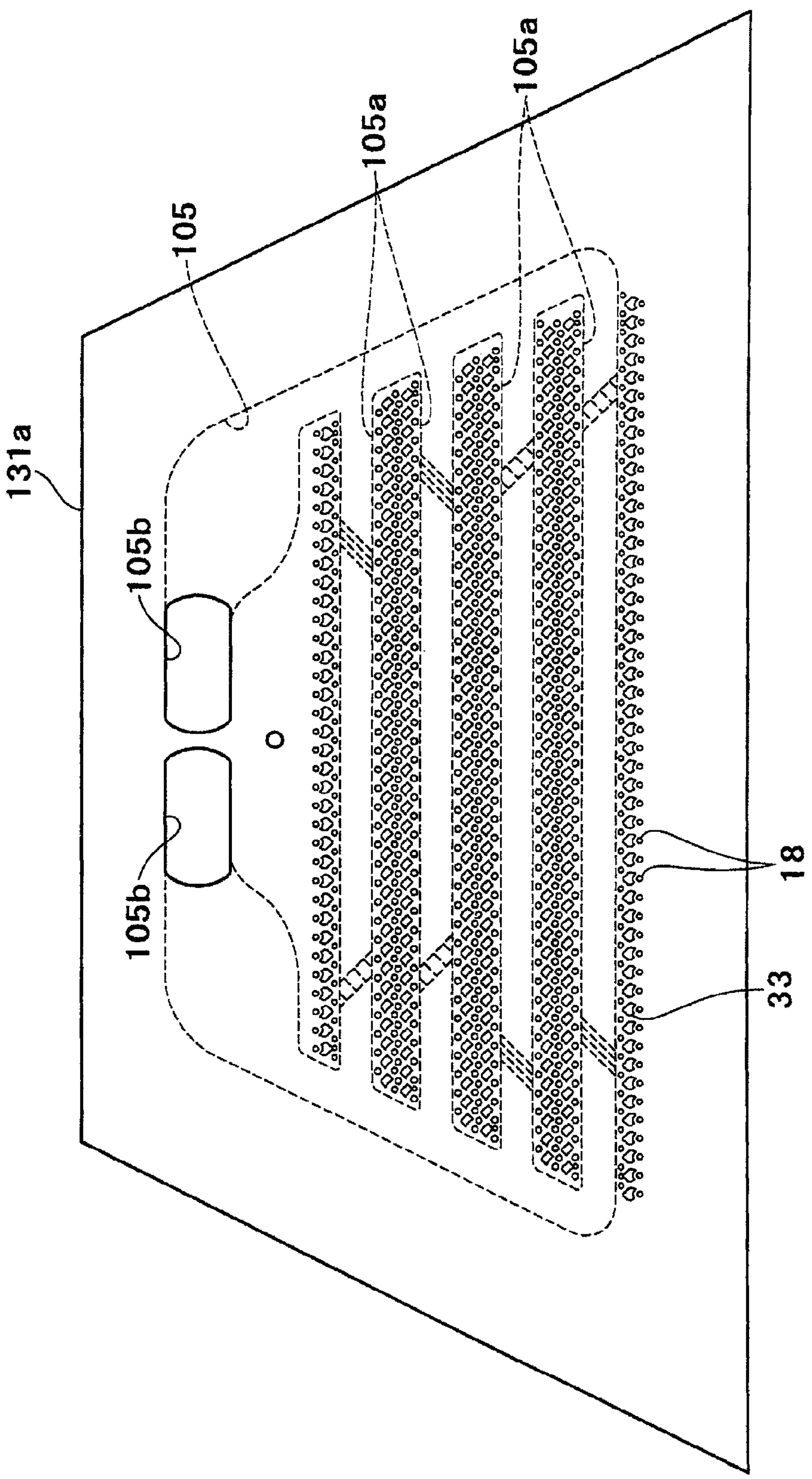
FIG. 15 is a plan view of a passage module according to a modification example.

In regard to the base portion onto which the plurality of passage modules 31*a* are assembled, although the manifold passages 105, communicating with the sub manifold passages 105*a* inside the respective passage modules 31*a*, are formed in the inside of the substrate 31*b* according to the above-described embodiment, such passages do not have to be formed. For example, as shown in FIG. 15, one passage module 131*a* may have the openings 105*b* and the manifold passage 105 in addition to the above-described passage configuration. In this case, there is no need to form the openings 105*b* and the manifold passages 105 in the substrate 31*b*, and the substrate 31*b* functions as a supporting member that supports the respective passage modules 131*a*.

Also, although the passage modules 31*a* are assembled into the openings formed in the substrate 31*b* in the above-described embodiment, the passage modules 31*a* may be assembled not into openings but into recesses formed in the substrate 31*b*, onto the upper surface of the substrate 31*b*, etc., instead.

An example of an embodiment where recesses are formed in the substrate 31*b* and the passage modules are assembled into the respective recesses shall now be described. Here, for example, just the portion of the plates 22 to 25 in FIG. 5 shall be the passage module. In these passage modules, portions of the individual ink passages 32 formed by the plates 22 to 25 (that is, the portions each made up of the passage from the exit of the sub manifold passage 105*a* to the pressure chamber 33, the pressure chamber 33, and a passage of an upper half portion from the pressure chamber 33 to the ejection port 18) are formed. The substrate 31*b* includes the plates 22 to 25 (upper laminate) and the plates 26 to 30 (lower laminate), through holes for assembling and housing the passage modules are formed in the plates 22 to 25 (upper laminate), and a common ink passage spanning across all head modules 10*x* (a passage leading from the openings 105*b* to the sub manifold passages 105*a* through the manifold passages 105) and passages of lower half portions from the pressure chambers 33 to the ejection ports 18 are formed in the plates 26 to 30 (lower laminate). In the state where the upper and lower laminates are laminated to each other, the recesses for assembling the passage modules are arranged from the through holes formed in the plates 22 to 25 (upper laminate). The sub manifold passages 105*a* open to bottom surfaces of the recesses (upper surface of the plate 26). In this example, the ranking of the passage modules is performed based on the magnitude of the passage resistance of the apertures 34. In this example, the passage modules are housed substantially completely in the recesses of the substrate in a mode where the passage modules are hardly exposed to the outside, and thus a force cannot readily be applied directly to the passage modules from the outside. The falling off, etc., of the head module is thus prevented. Also, as another example, the portion of the plates 22 to 24 in FIG. 5 may be arranged as the passage modules. In this case, the number of parts of each passage module is low and manufacture is facilitated.

Further, an example of assembling passage modules onto the upper surface of the substrate 31*b* shall be described. For example, the portions of the plates 22 to 24 in FIG. 5 are arranged as the passage modules and the portion of the plates 25 to 30 is arranged as the substrate. In the passage modules in this case are formed portions of the individual ink passages 32 formed by the plates 22 to 24 (that is, a portion made up of each of the passage from the aperture 34 to the pressure chamber 33, the pressure chamber 33, and a passage of an upper half portion from the pressure chamber 33 to the ejection port 18 differing from the abovementioned upper half portion). On the upper surface of the substrate 31*b* (the upper surface of the plate 25 in the present example), the openings 105*b* are formed, and holes joining the sub manifold passages 105*a* and the apertures 34 and passages of lower half portions from the pressure chambers 33 to the ejection ports 18 differing from the abovementioned lower half portions are opened. Passages formed by the plates 25 to 30 of FIG. 5 (that is, a common ink passage spanning across all head modules 10*x* (i.e. a passage leading from the openings 105*b* up to points before the aperture 34 through the manifold passages 105 and the sub manifold passages 105*a*) and passages of lower half portions differing from the abovementioned lower half portions) are formed inside of the substrate. The ranking of the passage modules is performed based on the magnitude of the passage resistance of the apertures 34 in this example as well.

Figure 12:
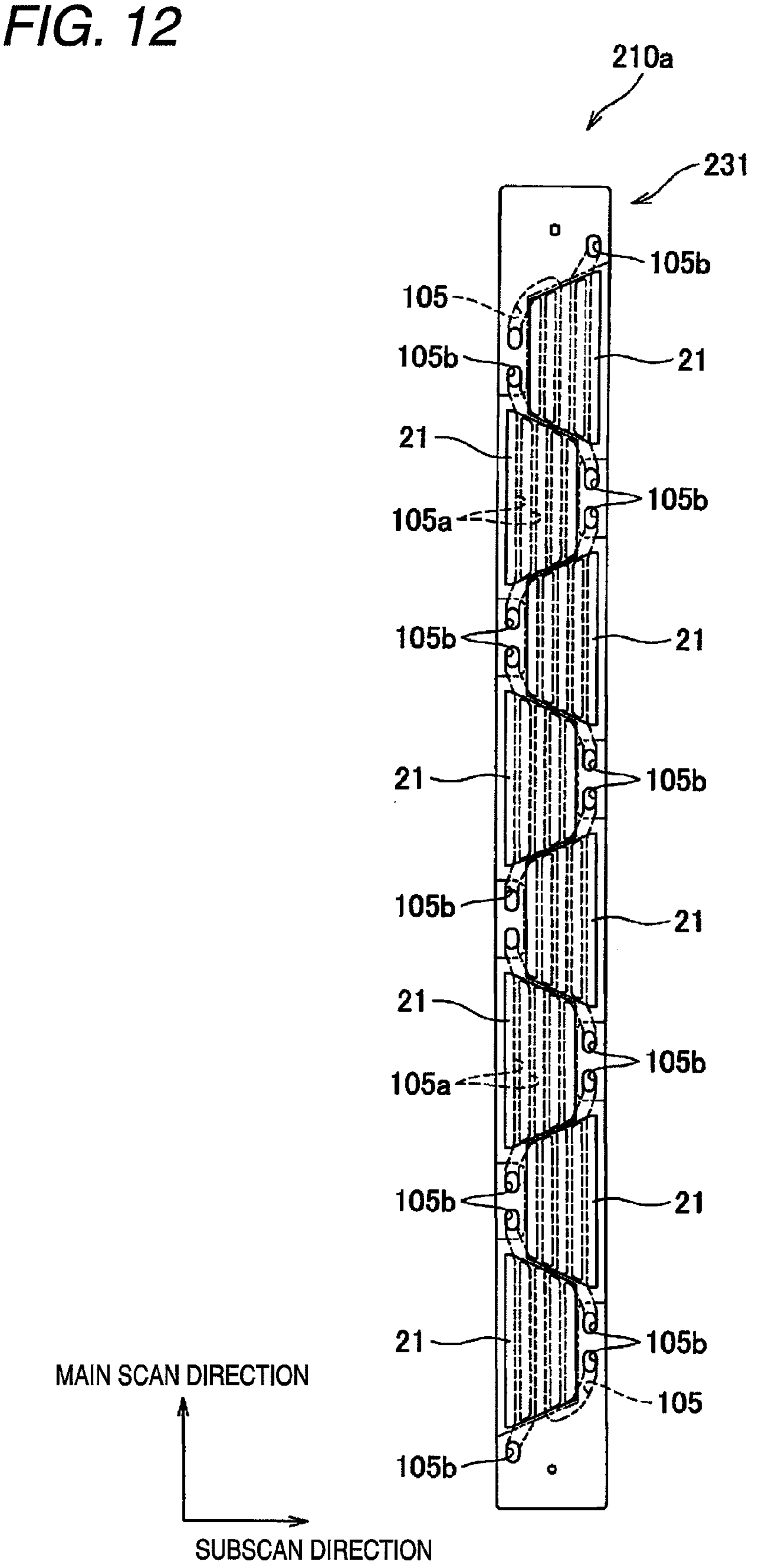
FIG. 12 is a plan view, corresponding to FIG. 3, of a main head body of an inkjet head according to another exemplary embodiment of the present invention.

Although, in the above-described embodiment, the passage unit 31 (see FIG. 3) includes the substrate 31*b* and the eight passage modules 31*a* made up of mutually independent members assembled onto the substrate 31*b*, the passage unit 31 is not restricted thereto. For example, as shown in FIG. 12, in another embodiment according to the present invention, a passage unit 231 included in a main head body 210*a* is not arranged by assembling the separately prepared substrate 31*b* and the eight passage modules 31*a* as in the above-described passage unit 31 but is arranged by laminating and adhering together a plurality of rectangular plates that are long in the main scan direction (plates having the same outer shape as the plates making up the substrate 31*b* in the above-described embodiment). Passages leading from the manifold passages 105 to the ejection ports 18 of the respective individual ink passages 32 are formed inside the laminate of the plates. With the present embodiment, adhesion portions of the actuator modules 21 in the passage unit 231 (trapezoidal portions shown in FIG. 12) correspond to being the passage modules.

Figure 13:
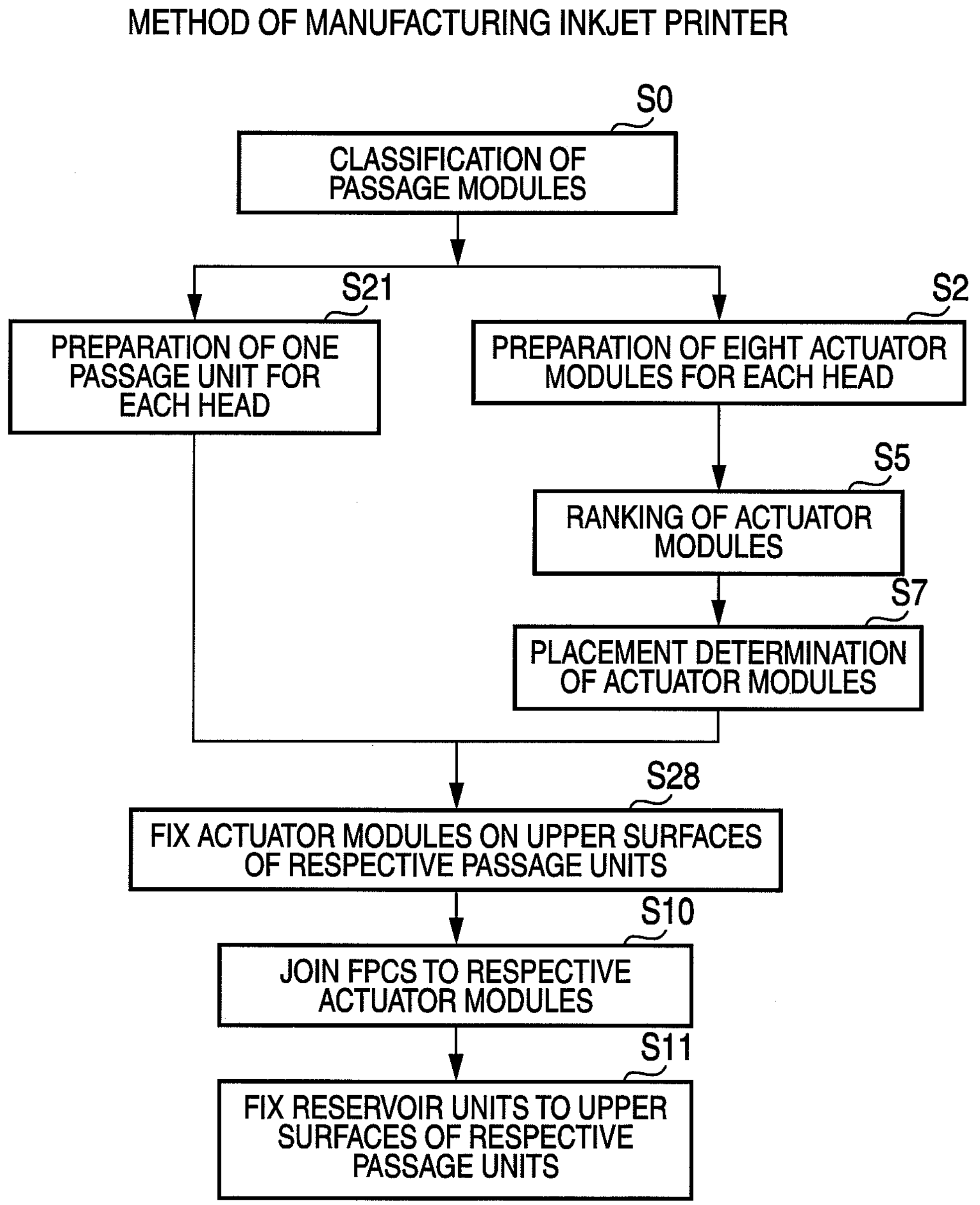
FIG. 13 is a process diagram, corresponding to FIG. 7, of an example of a method of manufacturing an inkjet printer including inkjet heads according to the other exemplary embodiment of FIG. 12.

A printer including heads having the passage units 231 of FIG. 12 is manufactured, for example, through steps shown in FIG. 13. Steps that are the same as the steps shown in FIG. 7 shall be provided with the same reference numbers and description thereof shall be omitted. First, for each head, one passage unit 231 and eight actuator modules 21 are separately prepared (S21 and S2). Thereafter, although ranking (S5) and placement determination (S7) are performed in the same manner as in the above-described embodiment in regard to the actuator modules 21, ranking (S4 of FIG. 7) and placement determination (S6 of FIG. 7) are not performed in regard to the passage modules. Then, in accordance with the placements determined in S7, the corresponding actuator modules 21 are fixed to the respective passage modules (trapezoidal portions shown in FIG. 12) on the upper surface of the respective passage units 231 (S28). Further thereafter, through the same steps S10, S11, etc., as the above-described embodiment, the heads and the printer according to the present embodiment are completed.

The ranking step (S5) of the actuator modules 21 is not restricted to ranking into three ranks, and ranking into not less than two ranks may be performed according to the number of region groups determined in the classification of the passage modules (S0).

Although being performed before the preparation of the passage modules 31*a* (S1) in the method of manufacturing shown in FIG. 7 and before the preparation of the passage unit 231 (S21) in the method of manufacturing shown in FIG. 13, the classification of the passage modules (S0) is not restricted thereto. That is, it suffices that this step be performed before the fixing of the actuator modules 21 to the respective passage modules of the passage unit, and for example, may be performed after the preparation of the passage modules 31*a* or the passage unit 231.

In the above-described embodiment, in regard to the classification of the passage modules (S0), the three regions sets of (1), (2), and (3) are assumed for one printer 1 (see FIG. 8), with each of (1) and (2) correspond to being a "terminal region group" and (3) corresponding to being a "central region group." However, it suffices that the passage modules be classified into the at least two region groups of the "terminal region group" that includes at least two passage modules and the "central region group" that includes at least one passage module. Alternatively, two or more sets positioned between the two region groups of the "terminal region group" and the "central region group" may be assumed to perform finer classification and ranking.

The classification of the passage modules and the placement determination of the actuator modules 21 based on ranking may be performed with a focus not on one printer but with a focus on the heads 10 and in accordance with each head 10.

The classification of the passage modules (S0) may be performed as follows. That is, in regard to the alignment direction of the passage modules, the two directions of the main scan direction and the subscan direction exist in the printer 1 according to the above-described embodiment as shown in FIG. 8. Here, by focusing on the subscan direction, the passage modules placed at terminal regions in regard to the subscan direction (all passage modules in the two heads 10 at the left side and the right side in FIG. 8) may be classified as belonging to the "terminal region group" and the other passage modules (that is, all passage modules in the two heads 10 sandwiched by the abovementioned two heads 10) may be classified as belonging to the "central region group." By then placing the actuator modules 21 based on the ranking, uniformity of the fluidity of the ink among the heads is realized. Alternatively, by focusing on the main scan direction, the passage modules placed at terminal regions in regard to the main scan direction (the two passage modules positioned at the respective ends in the main scan direction in each head 10 in FIG. 8 or these two passage modules plus one or more passage modules adjacent to and positioned at the center side of these passage modules) may be classified as belonging to the "terminal region group" and the other passage modules (that is, the one or more passage modules in each head 10 positioned at the center in the main scan direction) may be classified as belonging to the "central region group."

Alternatively, in a case where one printer includes two of the heads 10, for example, the passage modules placed at terminal regions in regard to the main scan direction (the two passage modules positioned at the respective ends in the main scan direction in each head 10 or these two passage modules plus one or more passage modules adjacent to and positioned at the center side of these passage modules) may be classified as belonging to the "terminal region group" and the other passage modules (that is, the one or more passage modules in each head 10 positioned at the center in the main scan direction) may be classified as belonging to the "central region group."

Alternatively, in a case where one printer includes three heads aligned in parallel in the subscan direction and each head has one passage module 31*a*, for example, the passage modules placed at terminal regions in regard to the subscan direction (the passage modules of the two heads positioned at the respective ends in regard to this direction) may be classified as belonging to the "terminal region group" and the other passage modules (that is, the passage module of the central head sandwiched by the abovementioned two heads) may be classified as belonging to the "central region group." By then placing the actuator modules 21 based on the ranking, uniformity of the fluidity of the ink among the three heads is realized.

Although various configuration examples were described above in regard to the classification of the passage modules (S0) in one printer, various configurations may be considered in regard to the classification of the passage modules (S0) in one head as well. For example, although in a case where the head 10 has eight passage modules aligned in the main scan direction as in the above-described embodiment, the alignment direction of the passage modules is just the main scan direction, in a case where passage modules are arrayed in matrix form in two directions in one head, the "terminal region group" and the "central region group" may be determined by focusing on either or both of the two directions as the alignment direction of the passage modules.

Although being performed before the fixing of the actuator modules 21 to the respective passage modules 31*a* (S8) in the method of manufacturing shown in FIG. 7 and before the fixing of the actuator modules 21 to the passage unit 231 (S28) in the method of manufacturing shown in FIG. 13, the ranking of the actuator modules 21 (S5) is not restricted thereto. That is, this ranking (S5) may be performed after the fixing of the actuator modules 21 to the respective passage modules 31*a* (S8) in the method of manufacturing shown in FIG. 7 and after the fixing of the actuator modules 21 to the passage unit 231 (S28) in the method of manufacturing shown in FIG. 13. For example, after completing the respective heads 10 in one printer 1, the positions of the heads 10 inside the printer 1 may be determined based on the ranking (S5) so that the actuator modules 21 are positioned at appropriate positions. In this case, a more appropriate ranking based on capacitances closer to those during actual use is made possible.

Figure 14:
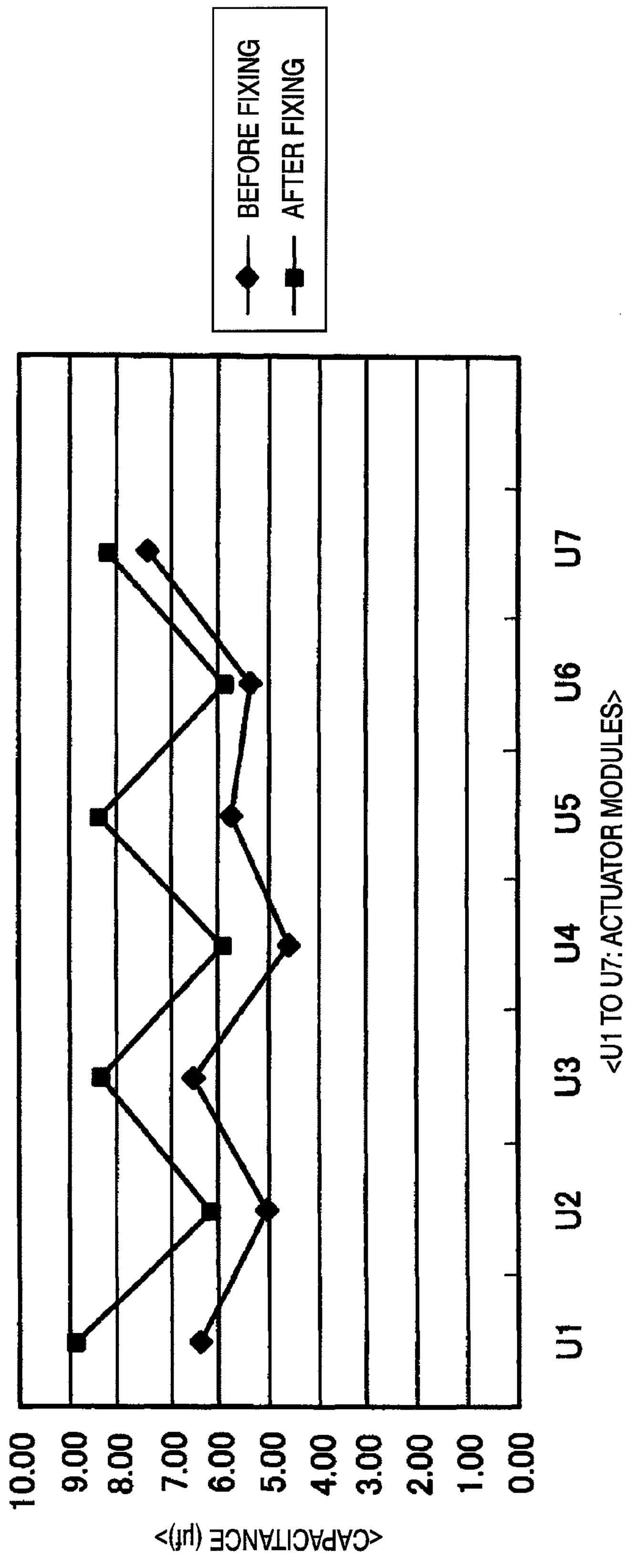
FIG. 14 is a graph of measured values of respective capacitances of seven actuator modules before and after fixing to passage modules.

By being fixed to the metal plates making up the passage modules 31*a* or the passage unit 231 in S8 or S28 described above, the actuator modules 21 are put in compressed states due to differences in linear expansion coefficients of the metal and ceramic materials. FIG. 14 shows results of measurements by the same method as the method of the above-described ranking step (S5) of the capacitances before and after fixing to the passage modules 31*a* for seven actuator modules 21 (U1 to U7) related to the above-described embodiment. Although as shown in FIG. 14, there is a tendency for the capacitances of the respective actuator modules 21 after fixing to be increased with respect to those before fixing, it can be understood from the two bent lines shown in the figure being substantially the same in shape that the relationship of the magnitudes of the capacitances among the actuator modules U1 to U7 is substantially the same before and after fixing. The trends of the magnitudes of the capacitances after fixing are thus obtained even in the case of performing the ranking (S5) before the fixing as in the above-described embodiment, and thus by placing the actuator modules 21 at the appropriate positions in accordance with the ranking, the effect of making the ink fluidity uniform can be obtained.

One driver IC 81 may be provided for a plurality of the actuator modules 21 instead of providing one each for each of the eight actuator modules 21.

Further, the passage modules and the actuator modules are not restricted to being respectively aligned along the longitudinal direction of the head and may instead be aligned along the width direction of the head. Also, the planar shapes of the passage modules and the actuator modules are not restricted to trapezoidal and may be, for example, parallelogram, triangular, square, rectangular, etc.

The number of liquid ejection heads included in the recording apparatus is not restricted to four and suffices to be not less than two. Alternatively, in each of the plurality of liquid ejection heads included in the recording apparatus, it suffices that there be not less than one each of the passage module and the actuator module. For example, in a recording apparatus that includes two heads, each having one passage module and one actuator module, the ranking is performed among the two heads.

The liquid ejection head according to the present invention may be a head that ejects a liquid other than ink, and is applicable to a thermal, dot impact, or other system besides an inkjet system, and is also applicable to a facsimile and copy machines, etc., in addition to being applicable to a printer. Also, the liquid ejection head according to the present invention is also applicable to both line type and serial type recording apparatuses.

What is claimed is:

1. A method of manufacturing a liquid ejection head having: not less than three passage modules, each passage module including a plurality of individual passages, each individual passage leading through a pressure chamber to a liquid ejection port that ejects a liquid; not less than three actuator modules, each actuator module including a plurality of actuators, which respectively apply pressure to the liquid in the plurality of pressure chambers in each passage module; and a drive unit, which is thermally coupled to the passage modules in such a manner that heat can be transferred between the drive unit and the passage modules and which supplies a drive voltage to the actuator modules corresponding to the passage modules;

the method of manufacturing comprising:

ranking each actuator module among the actuator modules respectively according to a magnitude of a capacitance of the plurality of actuators associated with that actuator module;

classifying at least one of the passage modules respectively into a terminal region group, which includes at least two passage modules placed in a terminal region in regard to at least one alignment direction of the passage modules, and at least one of the passage modules into a central region group, which includes at least one passage module placed in a central region which does not overlap with the terminal region;

fixing the actuator modules that were ranked as having a capacitance not less than a predetermined capacitance in the actuator module ranking to the passage modules that were classified as belonging to the terminal region group in the passage module classifying;

fixing the actuator modules that were ranked as having a capacitance less than the predetermined capacitance in the actuator module ranking to the passage modules that were classified as belonging to the central region group in the passage module classifying and manufacturing the liquid ejection head using the actuator modules and the passage modules which are respectively fixed to each other.

2. The method of manufacturing the liquid ejection head according to claim 1, further comprising:

ranking the passage modules based on a magnitude of a passage resistance of the individual passages of the respective passage modules; and placing the passage modules so that the passage modules that were ranked during the passage module ranking as modules with individual passages that have a passage resistance less than a predetermined passage resistance are classified as belonging to the terminal region group, and so that the passage modules that were ranked as modules with individual passages that have a passage resistance not less than the predetermined passage resistance are classified as belonging to the central region group.

3. The method of manufacturing the liquid ejection head according to claim 2, wherein a dimension of a throttle portion, which is a constricting passage provided in each individual passage to adjust a flow rate of the liquid supplied to the pressure chamber, is used as a factor to determine the magnitude of the passage resistance when ranking passage modules.

4. The method of manufacturing the liquid ejection head according to claim 2, wherein a dimension of the liquid ejection port is used as a factor to determine the magnitude of the passage resistance when ranking the passage modules.

5. The method of manufacturing the liquid ejection head according to claim 2, wherein the ranking of the passage modules is performed based on the passage resistance of a portion of the plurality of individual passages in the passage module.

6. The method of manufacturing the liquid ejection head according to claim 5, wherein the ranking of the actuator modules is performed based on the capacitance of a portion of the plurality of actuators in the actuator module, and the portion of the actuators used for the actuator module ranking corresponds to the portion of the individual passages in the passage module used in the passage module ranking.

7. The method of manufacturing the liquid ejection head according to claim 1, further comprising:

preparing a passage unit including not less than three of the passage modules, which are each made up of mutually independent members, by assembling the not less than three passage modules onto one base portion.

8. The method of manufacturing the liquid ejection head according to claim 1, wherein one drive unit is provided for each actuator module.

9. The method of manufacturing the liquid ejection head according to claim 8, further comprising aligning the passage modules and the actuator modules respectively along a longitudinal direction of the liquid ejection head and aligning a plurality of the drive units along the longitudinal direction of the liquid ejection head so as to respectively correspond to the plurality of passage modules.

10. The method of manufacturing the liquid ejection head according to claim 1, wherein the ranking the actuator modules comprises ranking the actuator modules into not less than three ranks.

* * * * *